United States Patent [19]

Adolfsson et al.

[11] Patent Number: 4,577,189
[45] Date of Patent: Mar. 18, 1986

[54] CIRCUITS WITH ELECTRO-OPTICAL FEEDBACK FOR DISPLAY AND A DIGITIZER APPLICATION

[75] Inventors: Morgan Adolfsson; Iorgny Brogardh; Christer Ovren, all of Västerås, Sweden

[73] Assignee: ASEA Aktiebolag, Västerås, Sweden

[21] Appl. No.: 363,598

[22] Filed: Mar. 30, 1982

[30] Foreign Application Priority Data

Apr. 2, 1981 [SE] Sweden .............................. 8102109

[51] Int. Cl.$^4$ ................................................ G09G 3/00
[52] U.S. Cl. ................................ 340/794; 250/213 A; 250/331; 340/784; 340/754
[58] Field of Search ............... 340/784, 781, 794, 712, 340/365 P, 754, 753; 350/331 R, 332, 342; 250/331, 213 A

[56] References Cited

U.S. PATENT DOCUMENTS

| | | | |
|---|---|---|---|
| 3,073,963 | 1/1963 | Marko | 250/213 A |
| 3,226,553 | 12/1965 | Terlet | 250/213 A |
| 3,353,116 | 11/1967 | Trimble | 250/213 A |
| 3,825,922 | 7/1974 | Ralph | 340/781 |
| 3,944,817 | 3/1976 | Hilsum et al. | 350/342 |
| 3,947,842 | 3/1976 | Hilsum et al. | 340/784 |
| 4,031,552 | 6/1977 | Bosserman et al. | 340/781 |
| 4,051,462 | 9/1977 | Javan et al. | 250/213 A |
| 4,085,321 | 4/1978 | Sliva | 250/213 A |
| 4,087,687 | 5/1978 | Bean | 250/331 |
| 4,147,932 | 4/1979 | Lewis | 250/331 |
| 4,272,157 | 6/1981 | Collins, Jr. et al. | 350/342 |
| 4,413,885 | 11/1983 | Hareng et al. | 350/342 |
| 4,427,888 | 1/1984 | Galvin | 250/331 |
| 4,432,611 | 2/1984 | Wei | 350/342 |

Primary Examiner—Marshall M. Curtis
Attorney, Agent, or Firm—Watson Cole Grindle & Watson

[57] ABSTRACT

A device for transforming information in electrical form into optical form, where the optical information consists of light intensity, light polarization or spectral composition varying with time. The transformation of information takes place from electrical into optical form by means of optical modulators, e.g. liquid crystals, and the transformation from optical form into electrical form is arranged to be carried out with photo-detectors, the device comprising components to control or sense said optical modulators in one, two or three-dimensions with time, and to sense or control said photo-detectors. The invention is characterized in that said components consist of one or more circuits with electro-optical feedback, in which at least one optical modulator is located in the ray path between at least one light source, for example a light-emitting diode or laser diode, and at least one photo-detector, for example a photo-resistor or a photo-diode, the photo-detector being connected into at least one electrical circuit, to which the optical modulator is connected in such a way that positive and negative feedback is obtained in a feedback loop. At least one light source is arranged to illuminate one photo-detector through one modulator and the other photo-detector through the other modulator, and one modulator is connected to the electric circuit of the other photo-detector, and the other modulator is connected to the electric circuit of the other photo-detector, thus obtaining a cross connection with electro-optical feedback.

26 Claims, 42 Drawing Figures

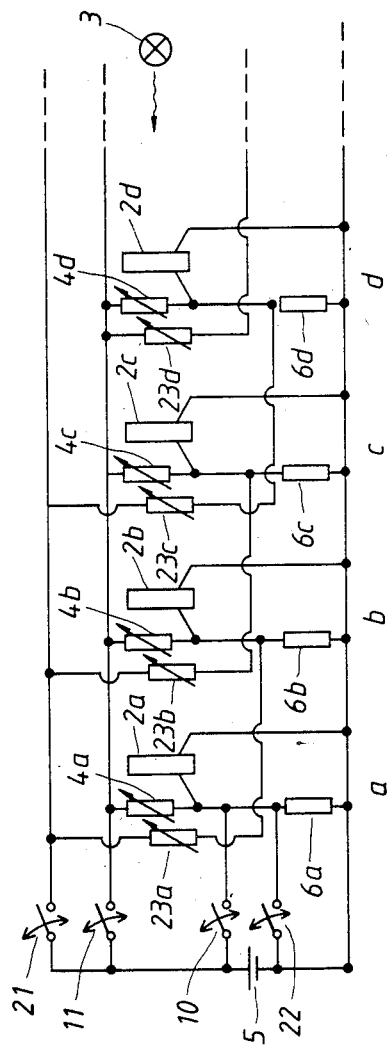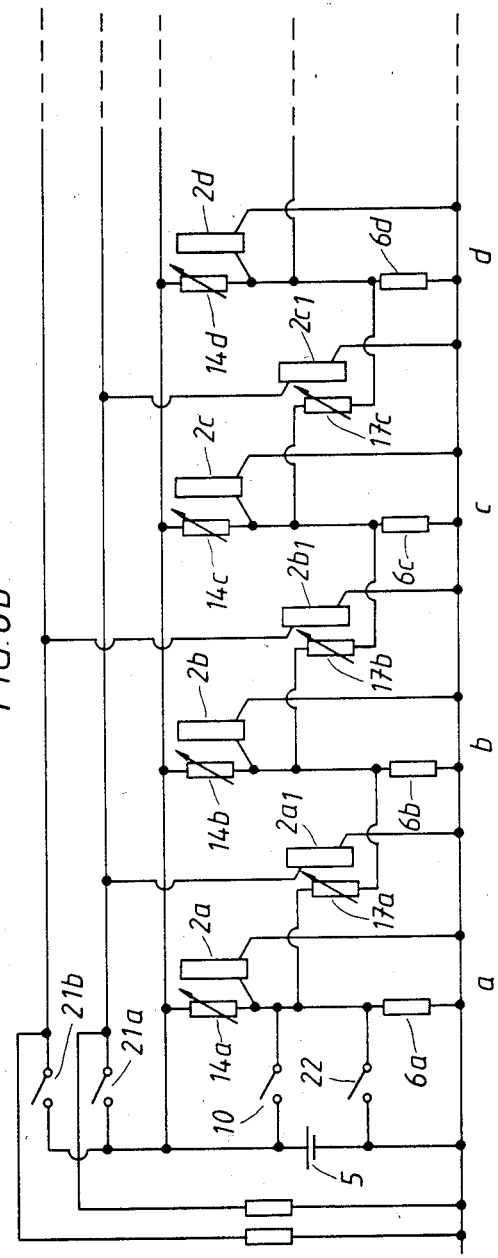
FIG.8a
FIG.8b

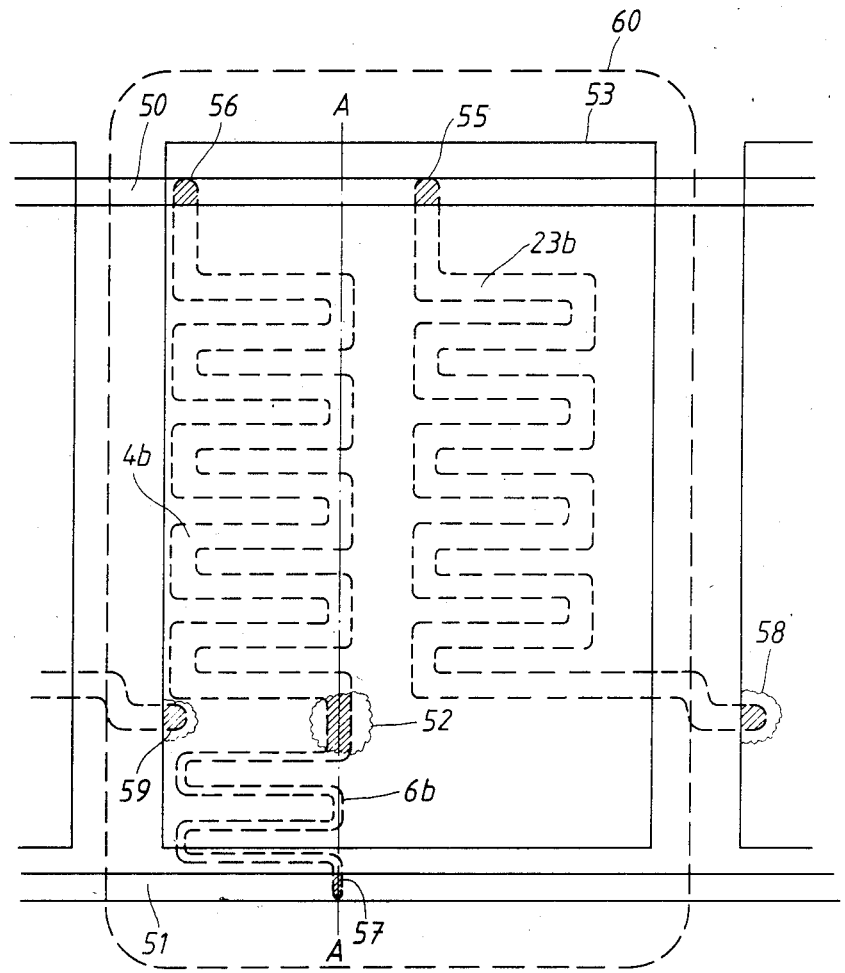
FIG. 14a
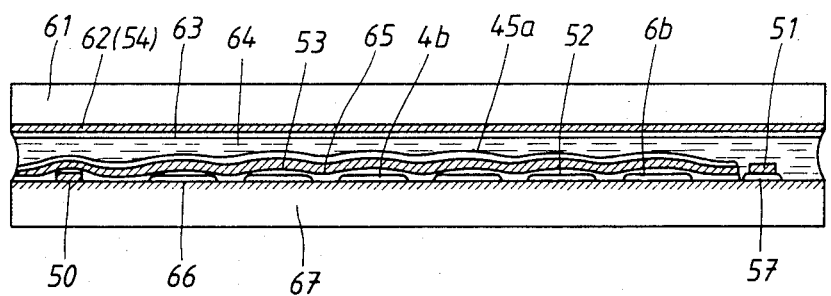
A - A    FIG. 14b

CIRCUITS WITH ELECTRO-OPTICAL FEEDBACK FOR DISPLAY AND A DIGITIZER APPLICATION

TECHNICAL FIELD

The present invention relates to a device for transforming information in electrical form into optical form and/or vice versa, where the optical information consists of light intensity and/or light polarization and/or spectral composition varying with time in one, two or three dimensions, and where the transformation of information from electrical into optical form is arranged to be carried out by optical modulators, such as e.g. liquid crystals.

Nowadays, for addressing flat displays XY matrices are normally used which are connected to IC circuits for addressing and multiplexing. For example, in the case of 512×512 picture elements, 1024 electric connections are required between the IC circuits and the display.

This problem is solved by the present invention, which introduces a new addressing technique which only requires two connections for the addressing. In addition, it is possible to create stationary pictures with arrays of liquid crystals without inherent memory effects and such a display can be used for digitizing the movement of, for example, an optical pen. The latter possibility can also be employed for measuring purposes, in which case the display will function as a photo-diode or a CCD matrix.

BRIEF DESCRIPTION OF INVENTION

In a device according to the invention, the transformation from optical form into electrical form takes place by means of photo-detectors, the device comprising components with the purpose of controlling and/or sensing optical modulators and sensing and/or controlling photo-detectors in one, two or three dimensions with time. The invention is characterized in that the components consist of one or more circuits with electro-optical feedback, in which at least one optical modulator, for example a liquid crystal modulator, is located in the ray path between at least one light source, for example a light-emitting diode (LED) or a laser diode, and at least one photo-detector, for example a photo-resistor or a photo-diode. The photo-detector is connected into at least one electrical circuit, to which the optical modulator is connected in such a way that positive and negative feedback coupling is obtained in a feed-back loop, defined by the light transmission of the optical modulator and further to the electric property of the photo-detector and further to the electric input signal of the optical modulator and further to the light transmission of the optical modulator, and/or that the circuits with electro-optical feedback consist of at least two separate optical modulators and photo-detectors. The photo-detectors are connected into circuits, and at least one light source is arranged to illuminate one of the photo-detectors through one of the modulators and the other photo-detector through the other modulator, and that one of the modulators is connected to the electric circuit of the other photo-detector and the other modulator is connected to the electric circuit of the first photo-detector, thus obtaining a circuit with electro-optical feedback. Thus, the central feature of the invention is memory elements with electro-optical feedback, which are series-connected to a shift register. The shift register may be built up of photo-resistor elements or photo-diodes, which may be integrated by, for example, thin film technology with an electric conductive pattern on a substrate, for example a large glass plate. The optical modulators which give rise to the electro-optical feedback coupling, may, for example, be a liquid crystal which is deposited between the substrate and a cover of, for example, glass which is coated on the inside with a light-polarizing layer and a transparent film. The shift register may be clocked electrically and/or optically. In the latter case the information is transferred between the memory cells in the shift register by switching two or more LEDs or laser diodes having different emission wavelengths in a specified order, whereby single-phase, two-phase or three-phase optical clocking can be obtained.

The invention relates to a new type of device for the primary modulation of optical displays and for the sensing of optical digitizers. With the devices which are described herein, serial or parallel electrical information may be introduced into a one- or two-dimensional optical modulator, which for display applications has the purpose of providing picture information to an observer. For transmission of information from man to machine, an optical pen may be used to enter optical information into the optical modulator, which optical information can be read electro-optically either in serial or in parallel form.

The devices within the ambit of this invention are based on electro-optical circuits which may be integrated in different ways together with optical modulators. In certain cases, also the optical modulators, which are included as active elements in the electro-optical circuits, may be used for light modulation in, for example, a display.

BRIEF DESCRIPTION OF DRAWINGS

Embodiments of the invention will now be described, by way of example, with reference to the accompanying drawings, in which:

FIGS. 1, 2, 3a–3f, 4a–4d, 5a, 5b, 6a, 6b, 7, 8a and 8b are circuit diagrams of basic electro-optical (EO) elements, which in different combinations can be used for constructing devices according to the invention, FIGS. 14a, 14b, 15a and 15b are circuit diagrams of EO memory elements according to the invention.

DESCRIPTION OF BASIC EO ELEMENTS

Figure 1:
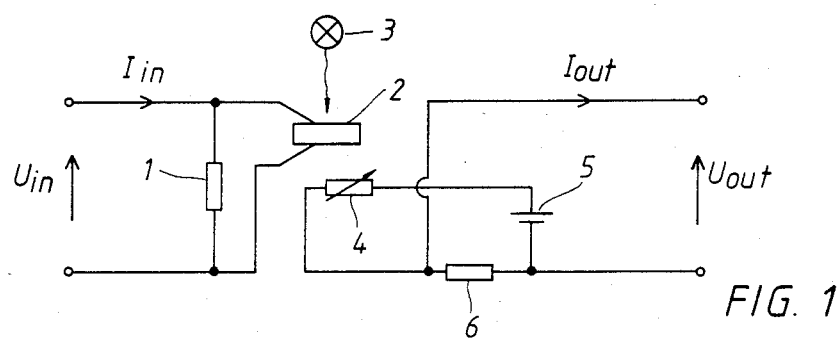

FIG. 1 shows a basic electro-optical (EO) circuit with an optical modulator 2 and a photo-detector 4. The optical modulator 2 may be of many different types, for example a liquid crystal, a Kerr cell, an electrically controlled Fabry/Perot filter, an electrically controlled double refracting filter, a Franz-Keldysh modulator, or an electrostatic light modulator. The function of the modulator 2, is to modulate the light from a light source 3 so that the effect of the light which reaches the photo-detector 4 can be controlled by means of an input voltage $U_{in}$. The photo-detector 4, which in FIG. 1 consists of a photo-resistor, is connected into an electrical circuit consisting of a voltage source 5 and a fixed resistor 6. An output voltage $U_{out}$ will appear across the resistor 6. A resistor 1 provides the input resistance to the optical modulator 2. If the modulator 2 consists of, for example, a liquid crystal, a high input resistance to the circuit is obtained, while at the same time the output resistance can be chosen to have a relatively low ohmic value. Between the input and the output of the EO circuit in FIG. 1 there is obtained a transmission characteristic (voltage amplification, current amplification, impedance conversion, etc.) which can be compared with a field effect transistor. This makes it possible in principle to build up amplifiers, active electronic filters, oscillators, non-linear links, switches, logical gates, delay elements, flip-flops, shift registers, memories, etc., with the aid of EO circuits according to FIG. 1. The invention is particularly related to devices for EO shift registers and memories to be used for addressing and/or modulation of light in one- or two-dimensional modulators and for sensing and/or reading in digitizers.

Figure 2:
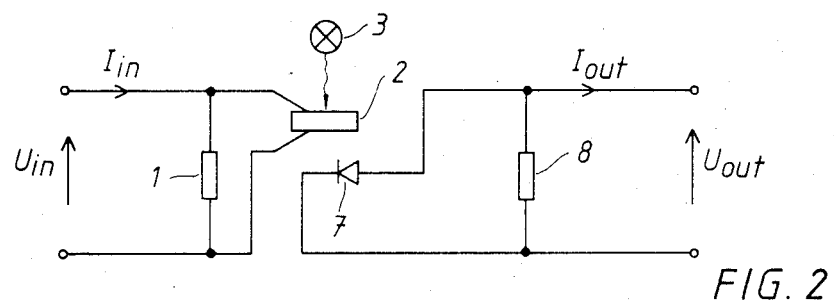

By making use of other types of photo-detectors than photo-conductors, such as photo-diodes, photo-transistors, photo-cells, photo-multipliers, photo-field effect transistors or photo-capacitances, a different transmission characteristic can be used. A circuit with a photo-diode which is of particular interest is shown in FIG. 2. The input stage is the same as in FIG. 1, but the output stage consists of a photo-diode 7, so that the voltage source 5 is no longer required. In principle the circuit according to FIG. 2 operates as a voltage/current converter, where the amplification can be controlled by the light intensity from the light source 3.

For making shift registers and memories in accordance with the invention, the possibility of making EO feedback couplings with the EO circuits in FIGS. 1 and 2 is of decisive importance. FIGS. 3a to 3f show six different examples of EO feedback coupling with photo-conductors, and FIGS. 4a to 4d show four different examples of EO feedback coupling with photo-diodes.

Figure 4A:
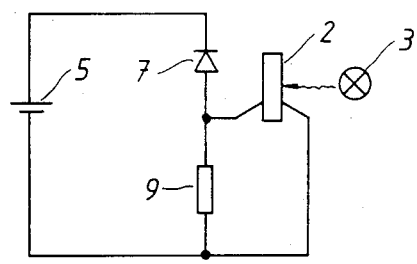
Figure 4B:
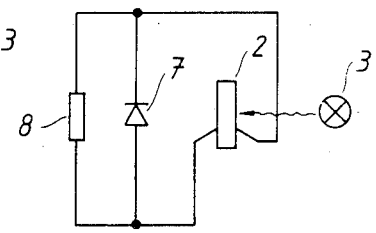
Figure 4C:
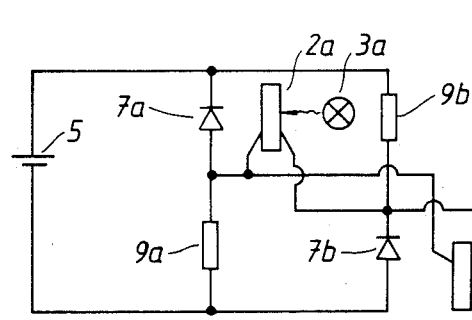
Figure 4D:
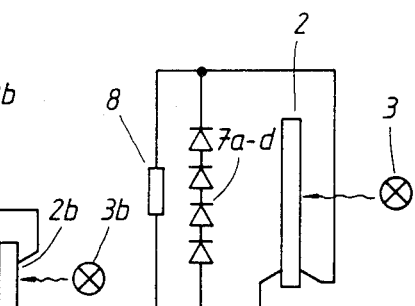
Figure 3A:
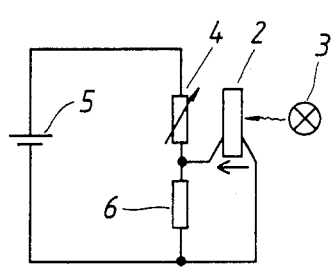
Figure 3B:
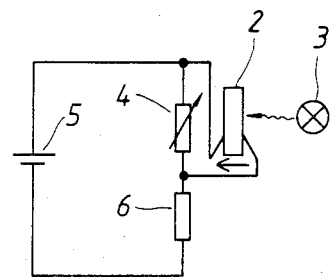
Figure 3C:
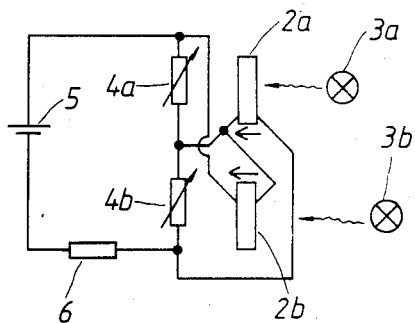
Figure 3D:
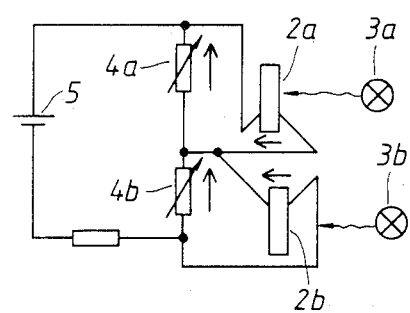
Figure 3E:
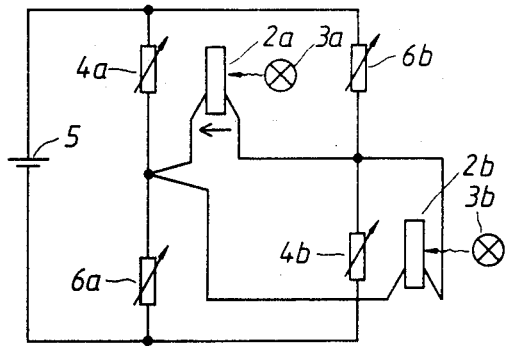
Figure 3F:
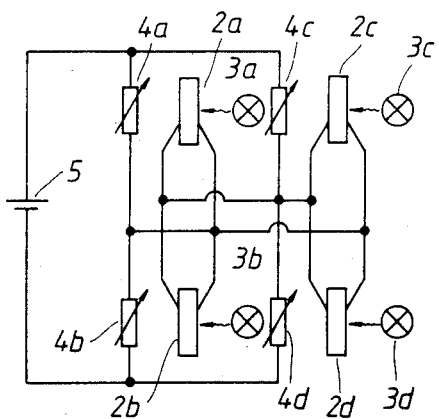

In FIG. 3a the input to the circuit in FIG. 1 is quite simply connected into the output of the circuit. In FIG. 3b the same thing is done, but with the difference that the output is now provided by the voltage appearing across the photo-conductor. If an increased voltage across the optical modulator 2 provides a reduced light attenuation and thus increased illumination of the photo-resistor 4 and a reduced resistance thereof, a positive feedback is obtained in the circuit of FIG. 3a and a negative feedback is obtained in the circuit of FIG. 3b. FIG. 3c and FIG. 3d show an additional photo-resistor 4b, which is also provided with an optical modulator 2b. Since the modulators are cross-connected, stronger non-linear relationships can be obtained which, however, is not necessary with the arrangement according to FIG. 4b. Negative feedbacks can be obtained by polarity reversal of the modulator 2. FIG. 4c shows an example of bridge connections with photo-diodes, and FIG. 4d shows the possibility of series-connecting photo-diodes to increase the modulating voltage applied to the modulator 2. The numerals 7, 7a–d are photo-diodes, 8, 9, 9a–9b are fixed resistors, 2, 2a–b are optical modulators and 3, 3a–b are light sources.

Figure 5A:
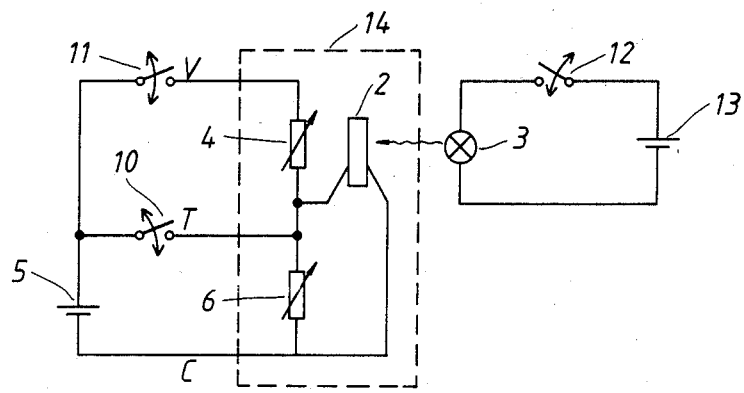

With the aid of the EO feedback couplings in FIGS. 3a–3f and 4a–4d, different types of memory elements and flip-flops may be constructed. Thus, FIG. 5a shows a simple memory element with photo-conductors. By means of a switch 10, the element is triggered, and by means of a switch 11 or 12 the element is set to "zero". Now, let it be assumed that the light source 3 is illuminated by the switch 12 being closed to switch a voltage source 13 into the circuit. If both switches 10 and 11 are open, no voltage appears across the resistor 6, and if the EO modulator has the characteristic shown in FIG. 5c, which can be obtained with, for example, liquid crystals, the transmission will be at a point A on the curve in FIG. 5c. When the switch 11 is closed, the voltage $U_{in}$ across the resistor 6 will increase, which according to FIG. 5c reduces the light transmission through the modulator 2, increases the resistance of the photo-resistor 4 and reduces the voltage $U_{in}$, i.e. a negative feedback is obtained, which gives the modulator a transmission value corresponding to a point B on the curve in FIG. 5c. This position can be represented by a logic "zero". If for a brief moment the switch 11 is closed, the voltage across the modulator 2 will be forced to pass the value $U_{trigg}$ on the curve, which means that the feedback changes from being negative to being positive, and the voltage $U_{in}$ rises rapidly to its upper limit $U_{max}$, representing a logic "one". If then the switch 11 or 12 is opened for a brief moment, a rapid return to position B on the transmission curve will occur, where it will remain until the switch 10 is closed again. A logic memory element is thus provided.

Figure 5B:
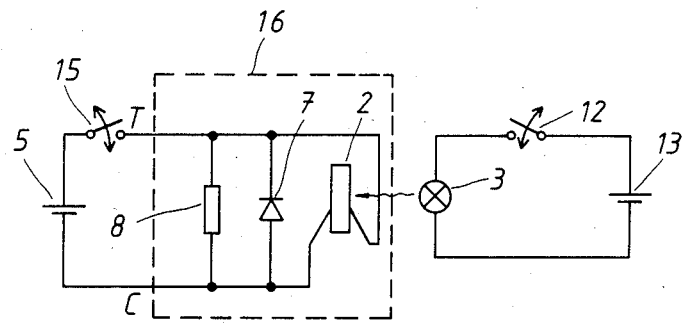
Figure 5C:
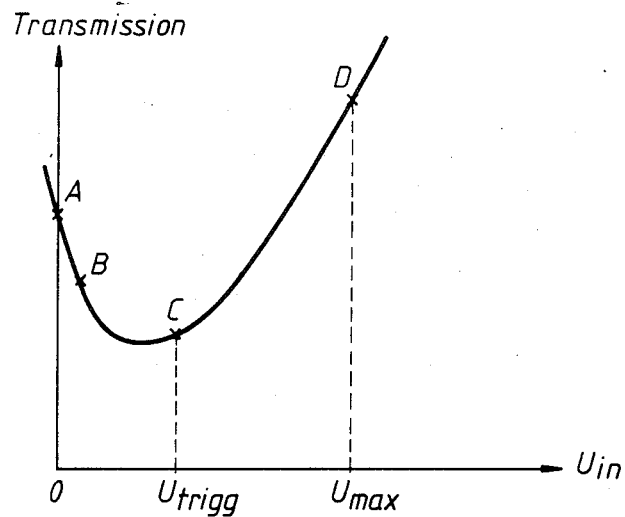
FIG. 5c is a graph of transmission against voltage for, inter alia the EO elements of FIGS. 5a and 5b, FIGS. 9, 10a, 10b and 11 are circuit diagrams for electrically switching EO shift register devices according to the invention.

FIG. 5b shows a corresponding memory element but with a photo-diode instead of a photo-conductor. With the switch 15 closed, a sufficiently high voltage is applied across the modulator 2 for the modulator to arrive at the positive inclination of the curve (i.e. to the right of point C in FIG. 5c) and for the memory element to be set to "one" by the photo-diode 7 maintaining the modulator 2 at the point D on the curve in FIG. 5c. By opening the switch 12 for a brief period, the memory element is set to "zero", since the modulator 2 will then return to the point B on the curve in FIG. 5c.

The memory properties of the elements in FIGS. 5a and 5b are obtained by two stable states of the EO feedback couplings, which are achieved by a non-linearity in the transmission characteristic of the optical modulators. An alternative way of feedback coupling to achieve memory properties is a cross-connection, which is exemplified with photo-resistors in FIG. 6a and with photo-diodes in FIG. 6b.

Figure 6A:
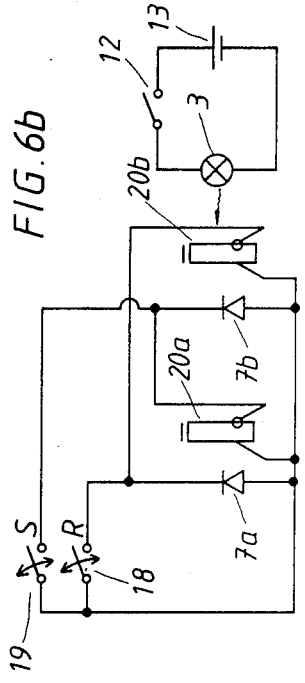

If in FIG. 6a, the switches 12 and 19 are closed and switch 18 is open, the modulator 2b will have a high light transmission, the photo-resistor 4b will have a low resistance, the modulator 2a will have a low voltage and a low transmission and the photo-resistor 4a will have a high resistance. If the switch 19 is opened, the high resistance of the photo-resistor 4a will give a maintained high voltage across the modulator 2b, and the modulator 2b will maintain a high transmission and the modulator 2a a low transmission. This condition can be defined such that the photo-resistor 4b is set to "zero" and the photo-resistor 4a is set to "one". Now, if the switch 18 is closed for a short period, the photo-resistor 4b will be set to "one" and the photo-resistor 4a will be set to "zero". An electro-optical SR flip-flop has thus been provided. The stability of the flip-flop in the two states is determined by the matching (amplification factor, neutral point value) between the components 2a, 4a and 2b, 4b as well as by the non-linearities of these components.

Figure 6B:
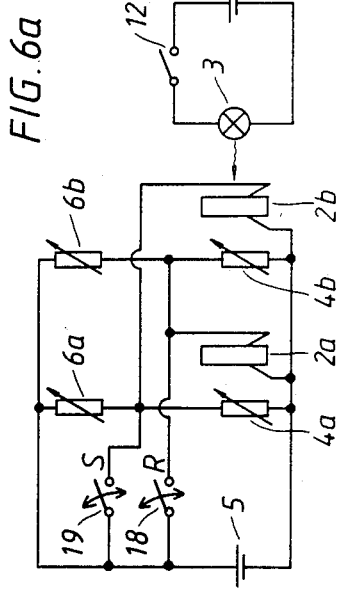

FIG. 6b shows an electro-optical SR flip-flop with photo-diodes. To obtain negative EO feedback couplings, optical modulators 20a and 20b with inverted characteristics are used, i.e. an increase of the voltage across the modulator gives a decrease of the light transmission. With the switch 12 switched on—provided the switch 19 is closed for a shorter period or longer period—the voltage across the modulator 20a will be low, the light transmission across 20a will be high, the voltage across the photo-diode 7a will be high, the voltage across the modulator 20b will be high, the light transmission through 20b will be low and the voltage across the photo-diode 7b will be low, etc. It can be said that the photo-diode 7a is set to "one" and the photo-diode 7b is set to "zero". If, instead, the switch 18 is closed, the SR flip-flop will flip over so that the photo-diode 7a is set to "zero" and the photo-diode 7b is set to "one".

MORE DETAILED COMBINATIONS OF EO ELEMENTS

Figure 7:
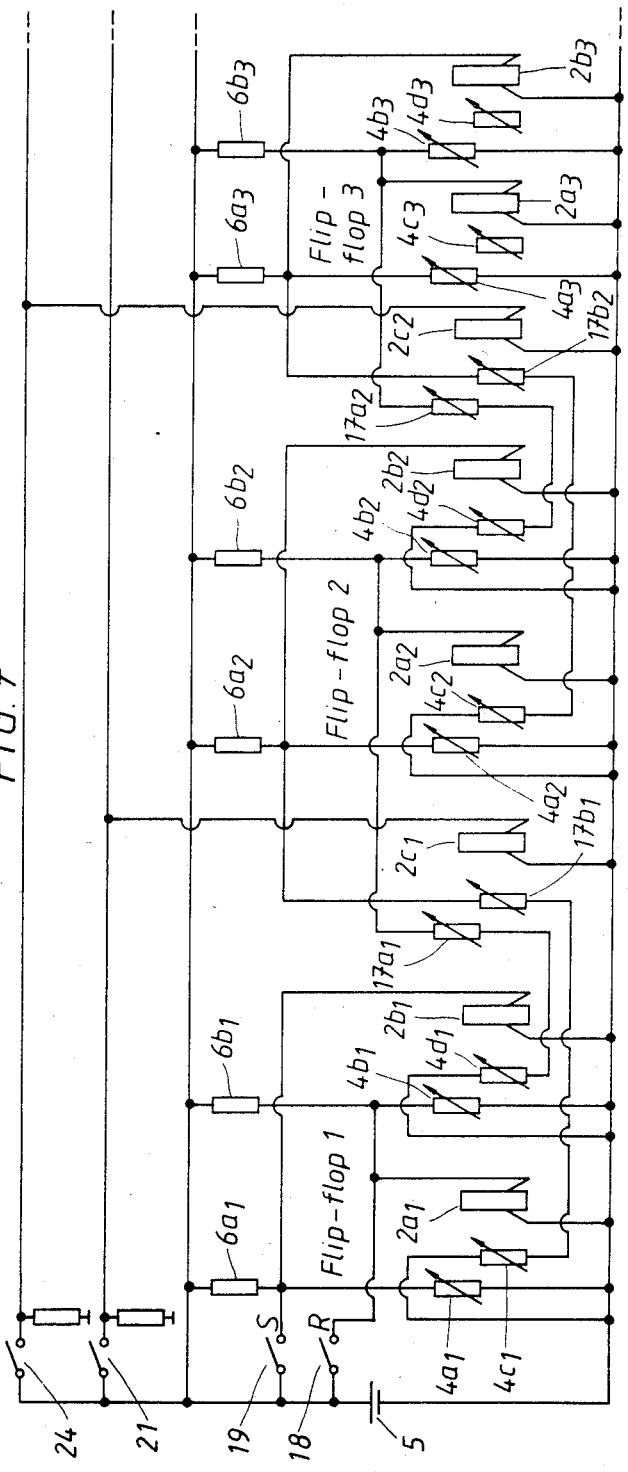

By cascade-connecting SR flip-flops, a shift register is obtained, which is exemplified in FIG. 7 by means of photo-resistor connections. If all the optical modulators are illuminated and the switches 21 and 24 open, the first SR flip-flop will operate as described with reference to FIG. 6a. Let it be assumed that the switch 19 has set the photo-resistor 4a1 to "one" and thus the photo-resistor 4b1 to "zero". If the switch 21 is closed for a moment, the light transmission through the modulator 3c1 will increase and the resistance of the photo-resistors 17a1 and 17b1 will decrease during the closing period. This causes the voltage to drop across 4b2 since this photo-resistor will be parallel-connected with 17a1 and 4d1, which are illuminated through the modulators 2c1 and 2b1, respectively, to which voltage is applied. Thus, both flip-flop 1 (4a1) and flip-flop 2 (4a2) will be set to "one". In the next phase the switch 18 can be closed, whereby the flip-flop 1 is set to "zero". Thereafter, the switch 24 can be closed for a moment, the logic "one" in the flip-flop 2 then being transmitted to the flip-flop 3, which is thus set to "one". If then switch 21 is again closed for a brief period, the "zero" is transmitted from the flip-flop 1 to the flip-flop 3 and the original logic "one" has thus been shifted three steps to the right. By using buffer stages 17a1, 17b1, 2c1, 17a3, 17b3, 2c3 etc. which are switched by the switch 21, and 17a2, 17b2, 2c2, 17a4, 17b4, 2c4 etc. which are switched by the switch 24, the flip-flops may be isolated from each other pairwise during the transmission of information, which considerably reduces the risk of degradation of the information compared with the case where the buffer stages are connected to one and the same switch. The flip-flops in FIG. 7 are controlled by two-phase clock pulses. In addition to single-phase and two-phase clocking, of course, three-phase clocking may be used as well.

If shift registers are built up from memory elements according to FIG. 5a instead of from flip-flops according to FIG. 6a, shift registers according to FIGS. 8a, 8b, 9 and 10a are obtained when using single-phase, two-phase, two-phase and three-phase clocking, respectively. If, in FIG. 8a, the light source 3 illuminates all the optical modulators 2a, 2b, etc., if the switch 11 is closed and if the switch 10 is closed for a brief moment, the optical modulator 2a will have a high light transmission and the photo-resistors 4a and 23a low resistance values as previously described with reference to FIG. 5a. If then the switch 21 is closed for a period corresponding to the time constant of the optical modulators, a sufficiently large pulse will be applied across the modulator 2b for the memory element b to be set to "one". By repeated switchings of the switch 21, "ones" will be shifted stepwise to the right in the shift register. To shift "zeros", a cooperation between the switches 21 and 11 is required in such a way that the switch 21 is first closed, whereafter 11 is opened, 11 is closed, and 21 is opened. In this way, the switch 21 will set all the elements to "one" which are located on the right of an element set to "one", whereas the switch 11 will set all the other elements to "zero".

FIG. 8b shows a shift register with two-phase clocking, where information transmission between the memory elements takes place with the aid of the same type of EO buffer stages as have been described with reference to FIG. 7. If the element on the left of a buffer is set to "one", the element on the right will be set to "one" upon closing the switch 21a or 21b, and if the element on the left is set to "zero", the element on the right will be set to "zero". The buffer stages are composed of optical modulators (2a1, 2b1, etc.) coupled to the switches 21a and 21b and photo-resistors (17a, 17b, 17c, etc.) coupled between the resistors (6 and 14) in two adjacent elements. The switches 21a and 21b are closed alternately (two-phase clocking) in order to isolate them pairwise during the transmission of information between the memory elements.

Figure 9:
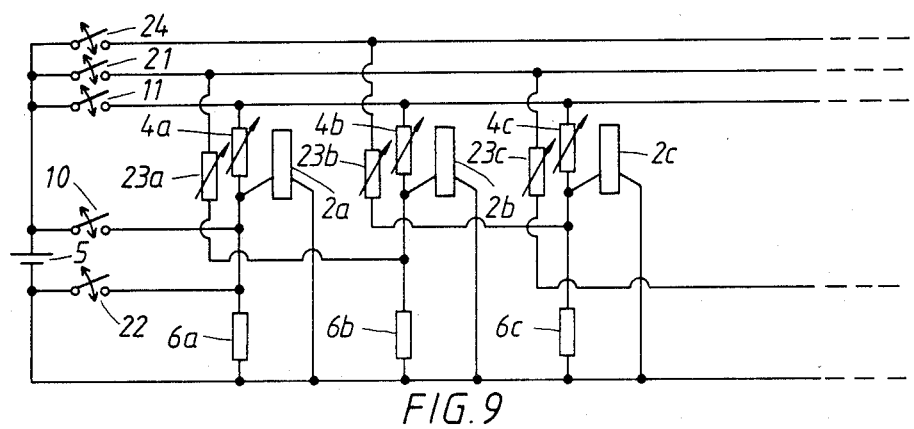

FIG. 9 shows a shift register with two-phase clocking according to the model in FIG. 8a. What is added in relation to FIG. 8a is a switch 24. The photo-resistor 23 of every second memory element for the transmission of information between the elements is connected to the switch 21, and every second memory element is connected to the switch 24. This means that the transmission of information takes place within isolated pairs, which eliminates the requirements for the clock pulse time (the time during which switches 21 and 24 are closed).

Figure 10A:
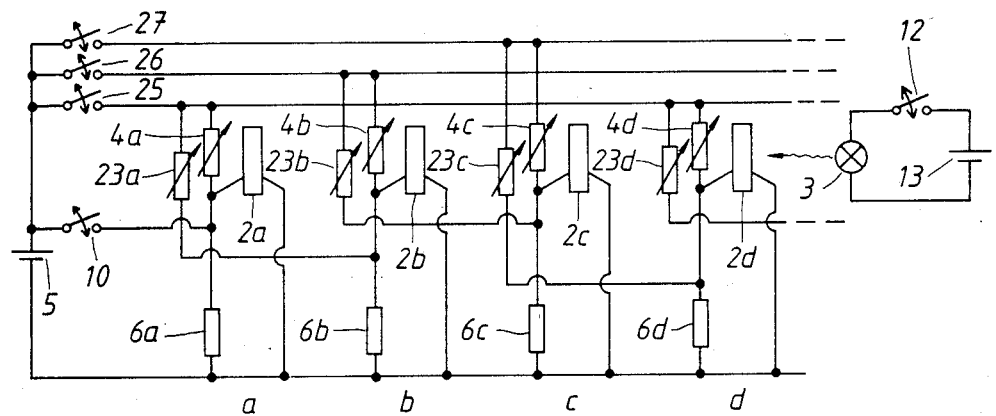

To facilitate the procedure during the shifting of "zeros" according to the principle of FIG. 8a, three-phase clocking according to FIG. 10a can be used. The memory elements are built up and interconnected in the same way as in FIG. 8a, but the photo-resistors are here supplied in a different manner. Thus, 23a and 4a are connected to the switch 25, 23b and 4b to the switch 26, 23c and 4c to the switch 27, 23d and 4d to the switch 25, etc., that is, every fourth memory element experiences the same clock pulse. To shift a "one" to the right, the following clock pulse sequence is required: 25 is closed, 10 is closed, 10 is opened (a set to 1), 26 is closed (b set to 1), 25 is opened (b isolated from a), 27 is closed (c set to 1), 26 is opened (c isolated from b), 25 is closed (a set to 0, d set to 1), etc. The whole shift register can be set to "zero" by opening all the switches 25–27 at the same time, or by extinguishing the light source 3 for a moment.

Figure 10B:
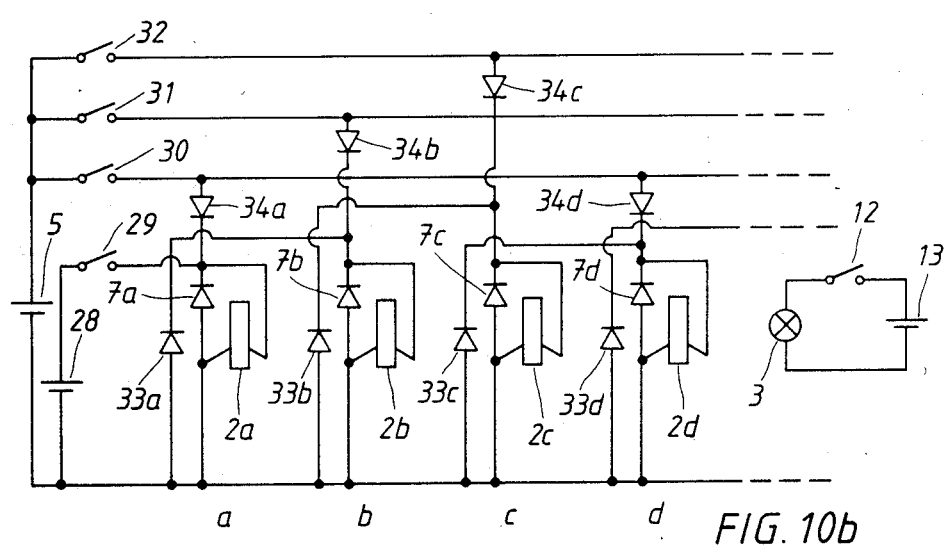

Shift registers can also be composed of photo-diode based memory elements (FIG. 5b), and one such is shown in FIG. 10b. The memory elements can be set to "zero" via clocking switches 30–32 and diodes 34a, b, c, etc., and the transmission of information between the memory elements is effected by the photo-diodes 33a, b, c, etc. A voltage source 28 is used to set the memory element a to "one" by means of the switch 29 during the input of information. The switching sequence for 29–32 when shifting a "one" through the register is as follows:

31 and 32 are closed (b and c set to "zero"), 30 is held open, 29 is closed, 29 is opened (a set to "one"), 31 is opened (b set to "one" by 33a), 30 is closed (a set to "zero"), 32 is opened (c set to "one"), 31 is closed (b set to "zero"), etc.

Figure 11:
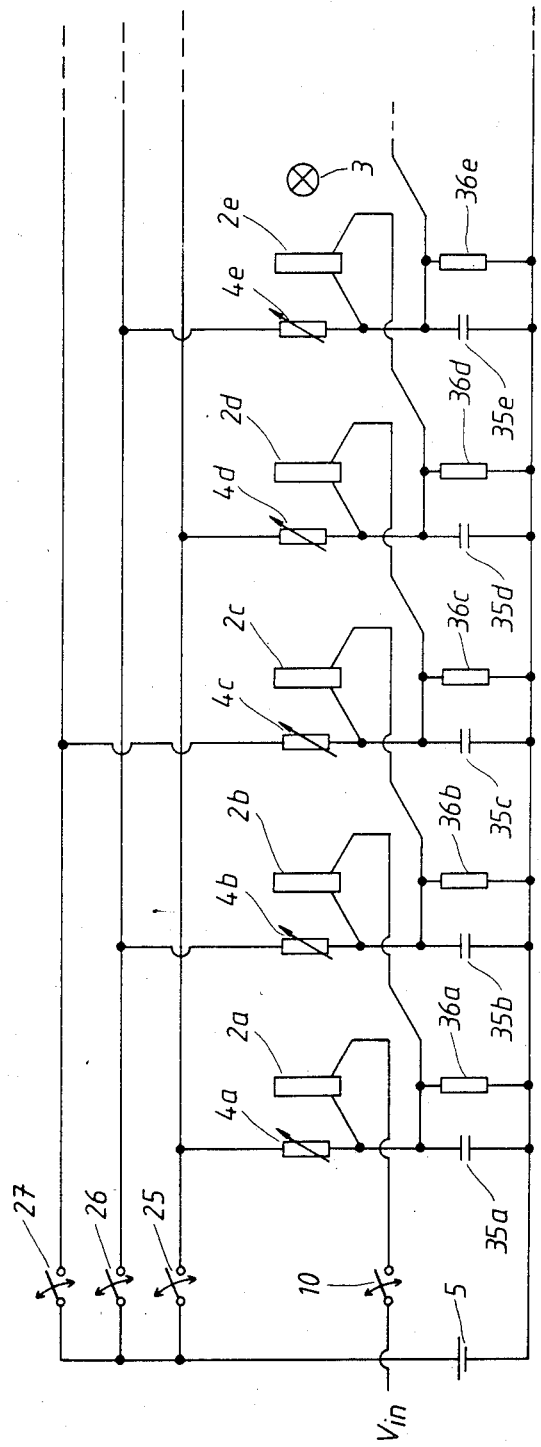

The shift registers discussed so far are inherently digital and are capable of shifting alternately "ones" and "zeros" representing two different light transmission values of the optical modulators. However, there are also possibilities of shifting analog information, which is exemplified in FIG. 11. The analog information is built up on capacitors 35a, b, c, etc., which have a certain leakage resistance, represented by resistors 36a, b, c, etc. The following switching sequence can be used.

10 is closed, 25 is closed (35a is charged to voltage $V_{in}$), 26 is closed (35b is charged to $V_{in}$), 25 is opened, 27 is closed (35c reaches $V_{in}$), 26 is opened, 10 is closed, 25 is closed (35d reaches $V_{in}$, 35a is given a new value of $V_{in}$), etc. The capacitors 35 are charged via the photo-conductors 4 and when the voltage across the modulators 2 is 0 V, the transmission has such a value that the current from 4a balances the leakage current through 36a. If $V_{in}$ is greater than the voltage across the capacitor, the light transmission is greater than this value and the capacitor 35 is charged. If $V_{in}$ is smaller, the capacitor is discharged through 36. To reduce the degradation during the transmission of information between the memory elements, buffer stages may be introduced (cf. FIG. 8b).

Figure 12:
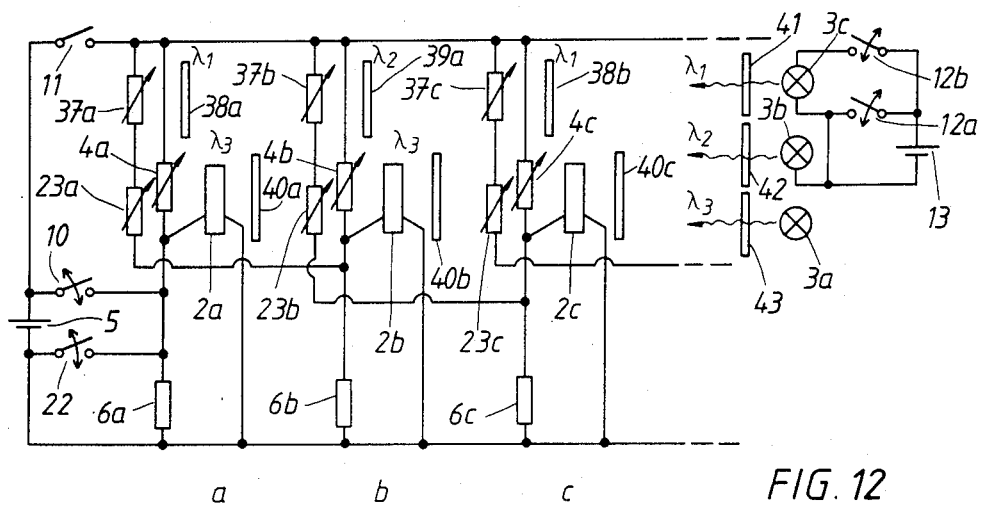
FIGS. 12, 13a and 13b are circuit diagrams of EO shift registers according to the invention which employ optical clocking.
Figure 13A:
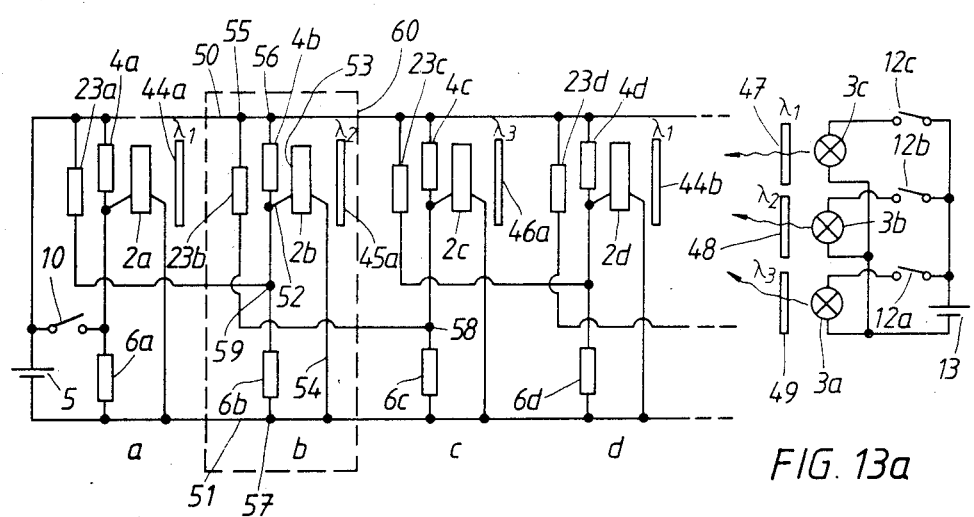
Figure 13B:
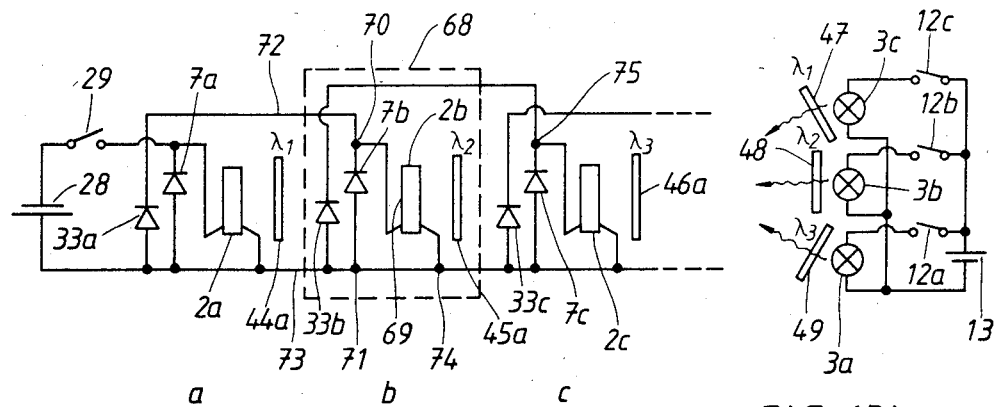

An alternative to using electric switches 21, 24, 25, 26, 27, 30, etc. to clock the EO shift registers, is optical clocking as exemplified by FIGS. 12, 13a and 13b. In the simplest case, the electric switches can be replaced by photo-resistors, which are switched by light, and this is shown in FIG. 12 in case of two-phase clocking (cf. FIG. 9). Compared with FIG. 9, FIG. 12 has a more simple electric conduction system but a more complex optical system. When shifting a logic "one", the following sequence is carried out with the switches 10, 12a and 12b: (It is presumed that the light source 3a at the optical filter 43 and the optical filters 40a, b, c, etc. continuously illuminates the modulators 2a, b, c, etc.).

The switch 11 is closed, 10 is closed for a moment (a set to "one"), 12b is closed for a moment (b set to "one" via 23a and 37a, 23a is illuminated by light source 3a via 43, 40a and 2a and 37a is illuminated by 3c via 41 and 38a when 12b is switched on), 12a is closed for a moment (c set to "one" via 23b and 37b, where 37b is illuminated by 3b), etc.

Because the optical filters 38a, b, c, etc. only let through light which is filtered by filter 41, filters 39a, b, c etc. only let through light from filter 42, and filters 40a, b, c, etc. only let through light from 43, the photo-conductors 37a, b, c can be optically addressed while at the same time light from 3a will not influence these photo-conductors.

Starting from the memory element coupling in FIG. 10a, a three-phase optically clocked shift register according to FIG. 13a can be obtained. Shifting of a "one" is carried out as follows:

12c is closed, 10 is closed for a moment (memory element a set to "one" by 5 increasing the voltage across 6a via 10, while at the same time 3c illuminates 4a and 23a via 47, 44a and the modulator 2a opened by 10), 12b is closed (b set to "one" since 3b via 48, 45a and 2b illuminates 4b), 12c is opened (a set to "zero"), 12a is closed (c set to "one" since 3a via 49, 46a and 2c illuminates 4c), 12b is opened (b set to "zero"), 12c is closed (d set to "one" while at the same time a "one" is fed into a if 10 is closed, otherwise a "zero" is fed in), etc.

Optical clocking can also be used with advantage for memory elements with photo-diodes (FIG. 5b), which is shown in FIG. 13b. A "one" is shifted as follows:

12c is closed and 29 is closed for a moment (a set to "one" by 29 triggering a and 3c via 47, 44a and 2a generates a photo-current in 7a, which holds 2a open also when 29 has been opened), 12b is closed (b set to "one" by photo-current from 33a and held set to "one" by 7b, which is illuminated by 3b via 48, 45a and 2b), 12c is opened (a set to "zero"), 12a is closed (c set to "one by 33b), 12b is opened (b set to "zero"), etc. As previously, 3c can only illuminate 2a, d, g etc., 3b can only illuminate 2b, e, h, etc., and 3a can only illuminate 2c, f, i, etc. This can be ensured by using, for example, optical bandpass filters with different center wavelengths $\lambda_1$, $\lambda_2$ and $\lambda_3$.

FIGS. 14a and 14b show how the memory element b in FIG. 13a can be realized when the optical modulators consist of a liquid crystal. FIG. 14b shows the element in cross-section at the section line A—A in FIG. 14a. With known technology for integrated thick-film and thin-film circuits and integrated semiconductor circuits, a substrate 67 is coated with a reflecting layer 66, a photo-resistance material 4b, a light-polarizing insulating material 65, electrically conducting layers 50, 51, a resistor material 6b, a transparent electrically conducting layer 53, and an interference filter layer 45a. Between the bottom substrate 67 and a transparent plate 61, which is coated on the bottom side with a transparent electrically conducting layer 62 and a light-polarizing layer 63, the liquid crystal 64 is applied. To obtain the transmission characteristic according to FIG. 5c, the polarization direction of the liquid crystal 64 is selected relative to the polarization direction of the polarizing layers 63 and 65 in such a way that the voltage 0 between 62 and 53 gives a certain light transmission whereas a somewhat increased voltage of 53 gives a reduced transmission. However, if the voltage of 53 is increased above a certain value, the transmission will increase again. Minimum transmission can be represented by the state where the difference between the polarization direction of the light that has passed 64 and the polarization direction of the polarizer 65 is 90°. Fine adjustment of the positions of the work points on the transmission curve according to FIG. 5c can be achieved by applying a suitable bias on 62.

The different electrical components in the memory element b in FIG. 13a can be identified in a simple manner in FIG. 14a and to a certain extent in FIG. 14b. The electrical feed is carried out through the conducting strips 50 and 51, which at points 55, 56 and 57 are connected to resistors 23b, 4b and 6b, respectively. The connections are obtained since the insulating layer 65 is not present. The same technique is used to connect, at point 52, the connection of 4b and 6b to the liquid crystal electrode 53 and to connect, at point 58, 23b to the electrode of the next memory element, corresponding to point 59 on the memory element b. There are, of course, ample possibilities of constructive variants; however, it is of great value that the design according to FIG. 14a does not require crossing conductors, resistors or photo-resistors.

Figure 15A:
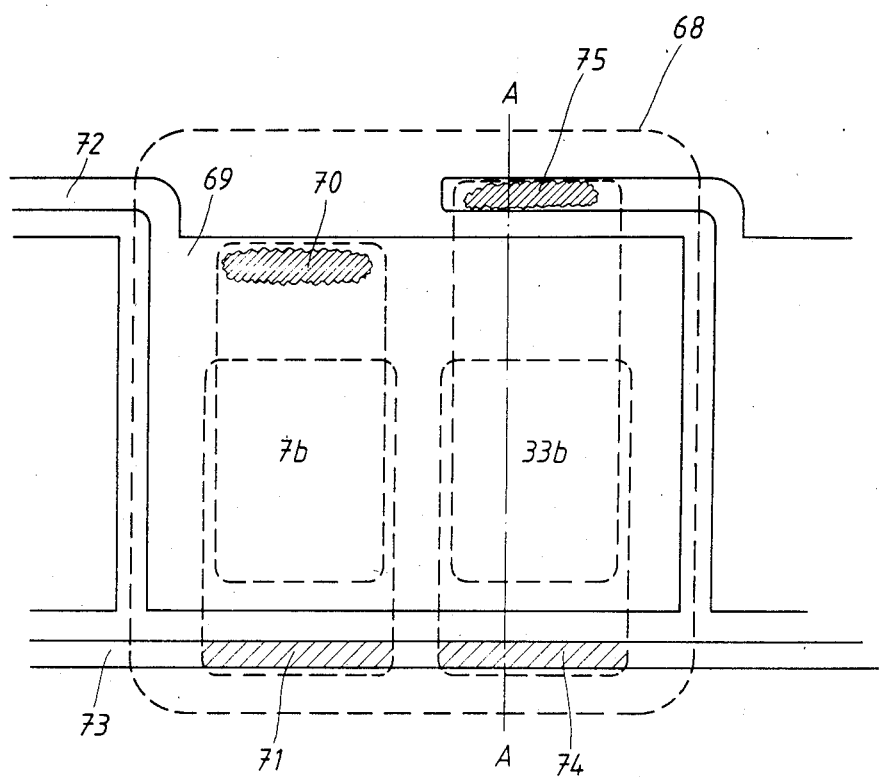
Figure 15B:
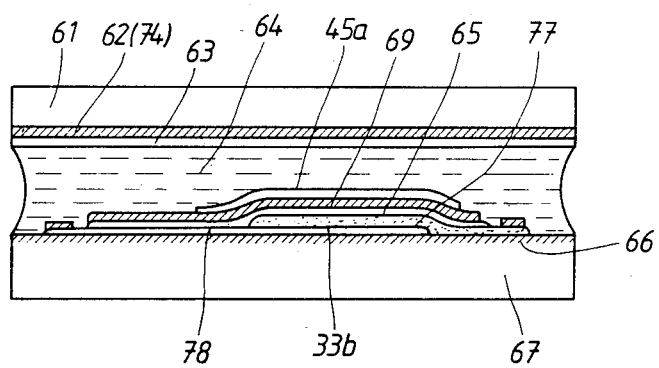

FIGS. 15a and 15b show an example of the realization of a memory element, built up of photo-diodes according to FIG. 13b. The photo-diodes consist of a p-layer 77 and an n-layer 78. The photo-diode 7b is connected at 70 to the electrode 69 and at 71 to the conductor 73. The photo-diode 33b is, at 75, connected to the electrode of the next memory element and, at 74, to the conductor 73. The interconnection between the memory elements is done, besides via 73, through an electrically conducting arm 72. The various layers in the memory element are clear from FIG. 15b, which constitutes a section on the line A—A in FIG. 15a. The bottom substrate 67 is coated with a mirror 66, an n-type semiconductor material 78, a p-type semiconductor material 77, a light-polarizing insulating material 65, a transparent electric conductor 69, an interference filter 45a, a liquid crystal 64, a polarizer 63, a transparent electrical conductor 62 and a transparent plate 61. The element is illuminated from the upper side. If the substrate 67 consists of a semiconductor, the photo-diode element can be manufactured with known technology.

Figure 16A:
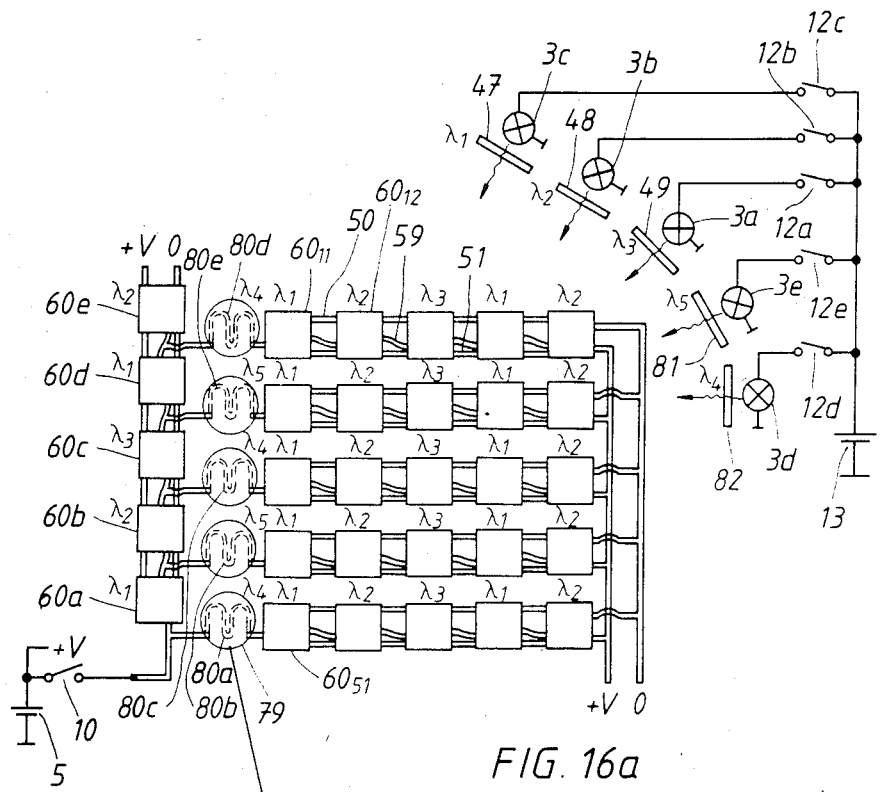
FIGS. 16a, 16b and 17 are circuit diagrams of electronically modulatable, two-dimensional EO displays according to the invention.
Figure 16B:
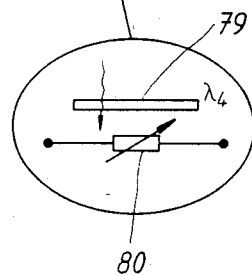
Figure 17:
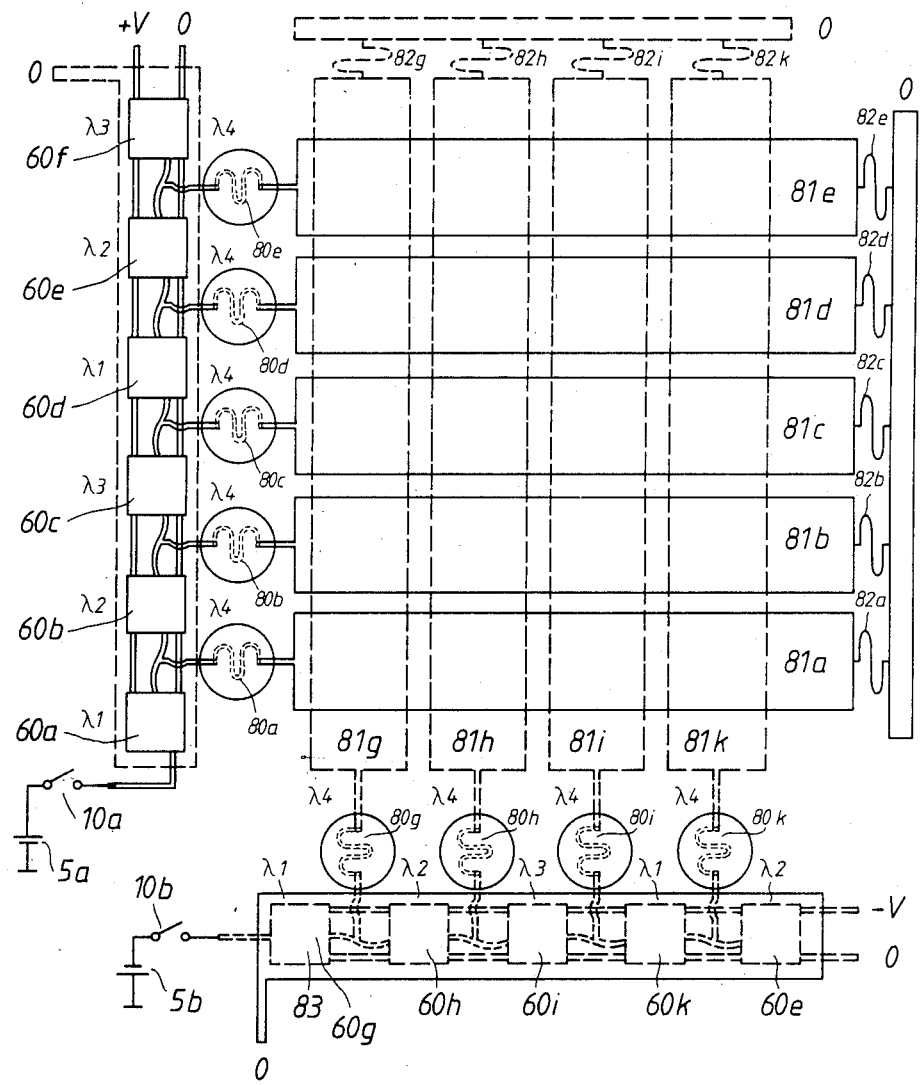

By means of shift registers built up according to the principles described with reference to FIGS. 7, 8, 9, 10, 11, 12, 13, 14 and 15, electronically modulatable displays can be built up, which is exemplified by FIGS. 16a and 16b and FIG. 17 showing two-dimensional displays with memory elements according to FIGS. 13a and 14. With the switch 10 the memory element 60a can be set to "one" when feeding in information, and with the switches 12a, b and c, the information can be shifted forwards in the shift register with the memory cells 60a, b, c, d and e. $\lambda_1$, $\lambda_2$ and $\lambda_3$ define the center wavelengths for the interference filters in the memory elements and in front of the light sources. With 60a–e, the information is fed forwards to the horizontal shift registers, which constitute the display proper. The transmission of information from the vertical to the horizontal shift registers is done via the photo-resistors 80a–d, which are provided with interference filters 79a–d with the center wavelengths $\lambda_4$ for every second filter and with $\lambda_5$ for the intermediate filters. Since the filters 81 and 82 in front of the light sources 3d and 3d have the center wavelengths $\lambda_4$ and $\lambda_5$ respectively, the switches 12d and e can be used to guide the information into the display. The photo-resistors 80 FIG. 16b) are connected between the points 58 (FIG. 14a) in the elements in the vertical shift register and the point 59 in the first elements in the horizontal shift registers. If $\lambda_1$, $\lambda_2$ and $\lambda_3$ are selected within the three main colours, a certain colour reproduction can be obtained by a suitable choice of switching sequence. During three-phase clocking, the size of the memory elements can be adapted to the density of information in such a way that a large display element is followed by two small memory elements before the next large display element enters into the shift register. If both plates 61 and 67 in FIG. 14b are made transparent, the display can be made of translucent design, in which case the light sources 3a–e are positioned behind the display, seen from the side of the viewer.

The shift register 60a–e according to FIG. 16a can be regarded as a y-address register. FIG. 17 shows how to make xy addressing by providing the plate 67 (FIG. 14b) with a shift register 60a–f, connected to the horizontal electrodes 81a–e, and the plate 61 with another shift register 60g–l, connected to the vertical electrodes 81g–k. When both plates 61 and 67 (FIG. 14b) are added together, the liquid crystal will constitute an optical modulator both for shift registers 60a–f and 60g–l and the display proper, which is controlled by the voltage between the transparent electrodes 81a–e and 81g–k. The shift register 60a–f is clocked by light sources which are positioned in a panel on the upper side of the plates 61, 67, and the shift register 60g–l is clocked by light sources which are positioned below the plates 61, 67. The photo-resistors 80a–k are used to read the voltage states of the memory elements of the shift registers between the clocking cycles. The photo-resistors 80a–k and resistors 82a–k are chosen such that if, for example, memory elements 60d and 60h are set to "one", the liquid crystal at the structure of crossing between 81d and 81h will acquire a transmission state which is different than that of the other crossing junctions. If the liquid crystal possesses a usable hysteresis effect, fixed images can be programmed into the display with the coupling shown in FIG. 17 by suitable switch sequences for the switches 10a, b. If the liquid crystal possesses no memory effect, ordinary scanning techniques can be used.

Figure 18:
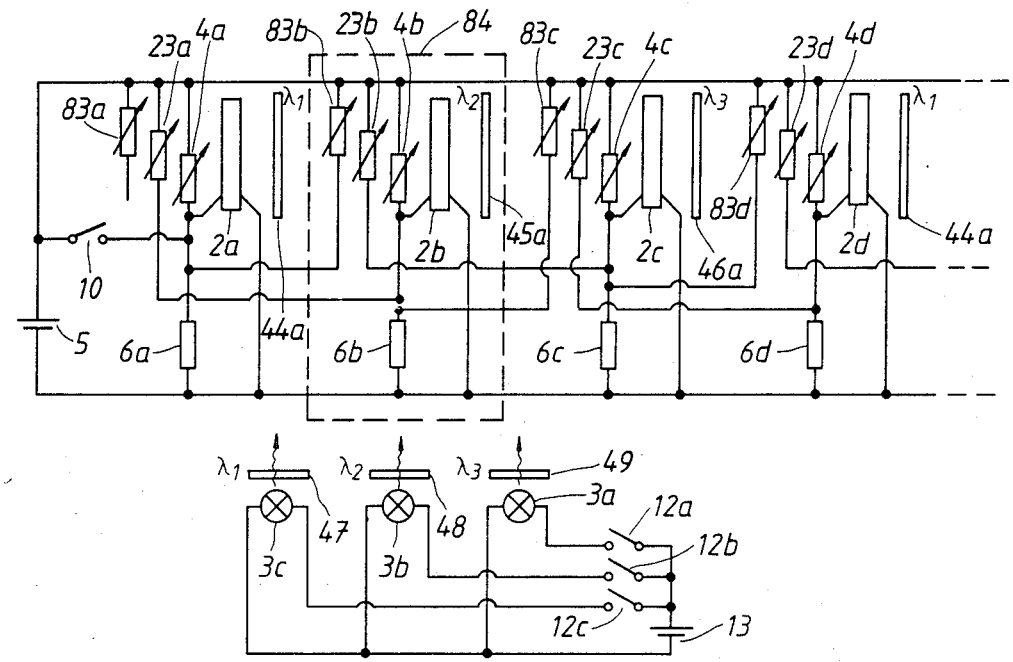
FIG. 18 is a circuit diagram of an EO shift register according to the invention which is capable of reversible operation.

In many connections using displays, a shift register which is capable of shifting in both directions may make the display functions more usable. In FIG. 18 it is shown how the shift register of FIG. 13a can be extended for reversible operation. What has been added in relation to FIG. 13a is only one photo-resistor 83 per memory element. With this photo-resistor, the information can be shifted back to the preceding memory element by controlling the light sources with reversed sequence.

Figure 19A:
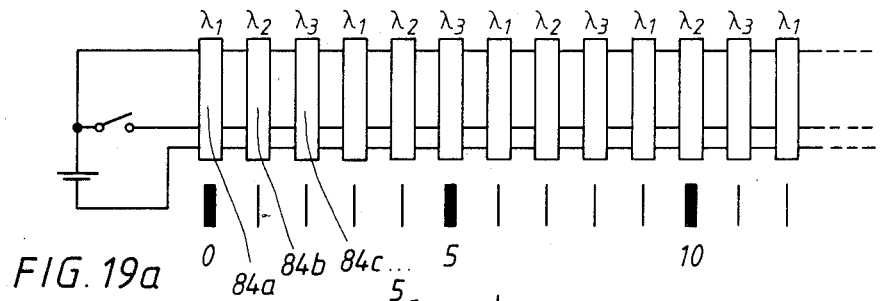
FIGS. 19a and 19b show bar and dial displays based on the construction used in FIG. 18.
Figure 19B:
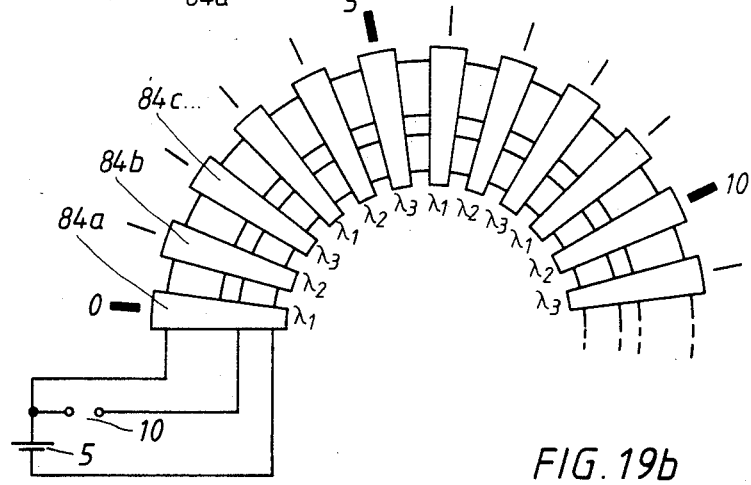

With reversible shift registers, simple bar displays and dial displays for registering purposes can be implemented according to FIGS. 19a and 19b. Logic "ones" are shifted in from the switch 10 to the right when the shown value rises and is shifted back to the left when the shown value drops. 84a, b, c etc. refer to the memory element 84 in FIG. 18 and $\lambda_1$, $\lambda_2$ and $\lambda_3$ to the center wavelengths of the interference filters 44a, b, c, 45a, b, c and 46a, b, c, etc. FIG. 19a shows a bar display and FIG. 19b a dial display.

Figure 20:
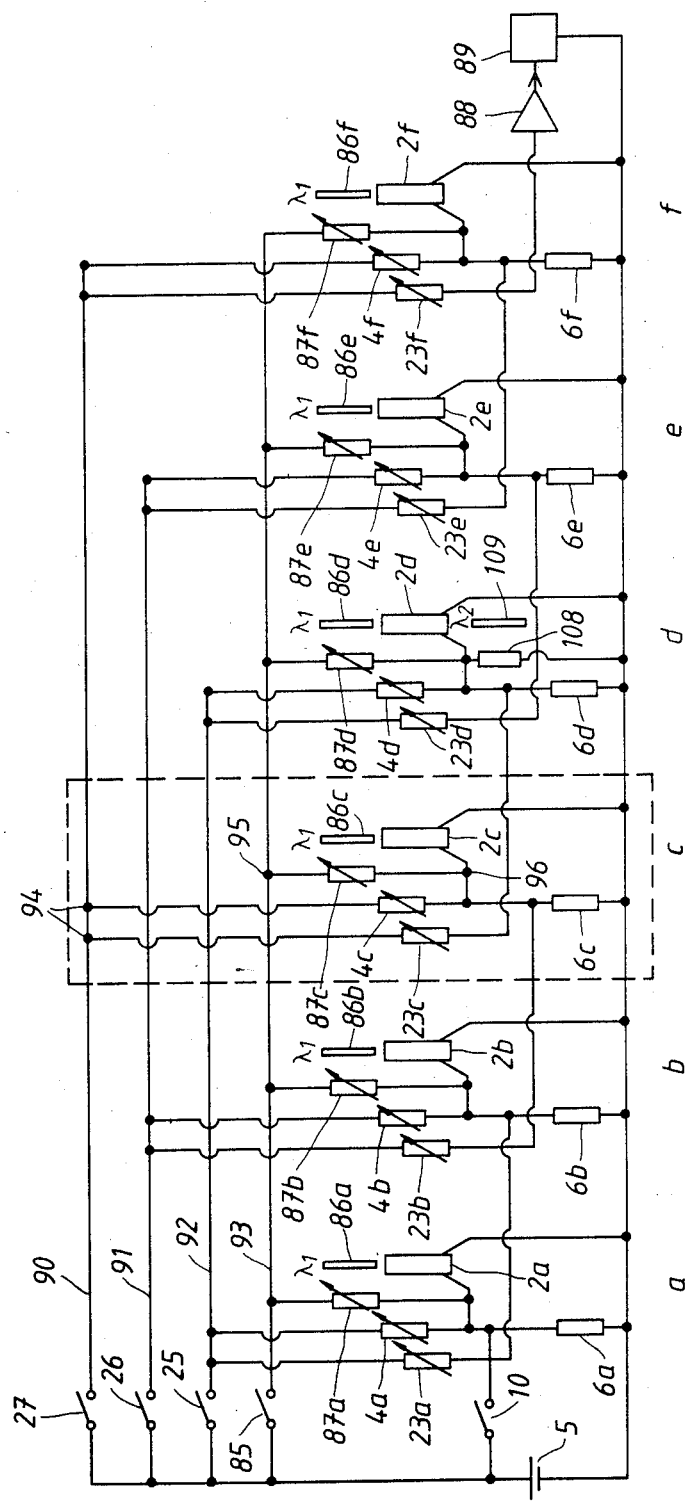
FIG. 20 is a circuit diagram of a modified EO memory element according to the invention.

Up to now, only feeding of electrical information to a display has been discussed. FIG. 20 shows a shift register which, in addition to being used for the feeding of electrical information in series form via the switch 10, can also be used for parallel feeding of optical information, which in electrical series form can be switched out to the amplifier 88 and the electronic unit 89, which, for example, may be a computer. The shift register is a modification of the shift register shown in FIG. 10a, but, of course, a corresponding modification can also be made for the other shift registers described. The modification comprises providing the respective memory elements with respective third photo-resistors 87a–87c, which can set the respective memory element to "one" if the switch 85 is closed and light around the wavelength $\lambda_1$, which is transmitted through the respective filters 86a–86f, illuminates the photo-resistor. The illumination of the modulators 2a, b, c, etc. in the shift register is chosen in such a way that it does not comprise wavelengths around $\lambda_1$. To set a memory element to a "zero" (erase function), a light wavelength $\lambda_2$ can be used (see memory element d with the additional photo-resistor 108).

Figure 21A:
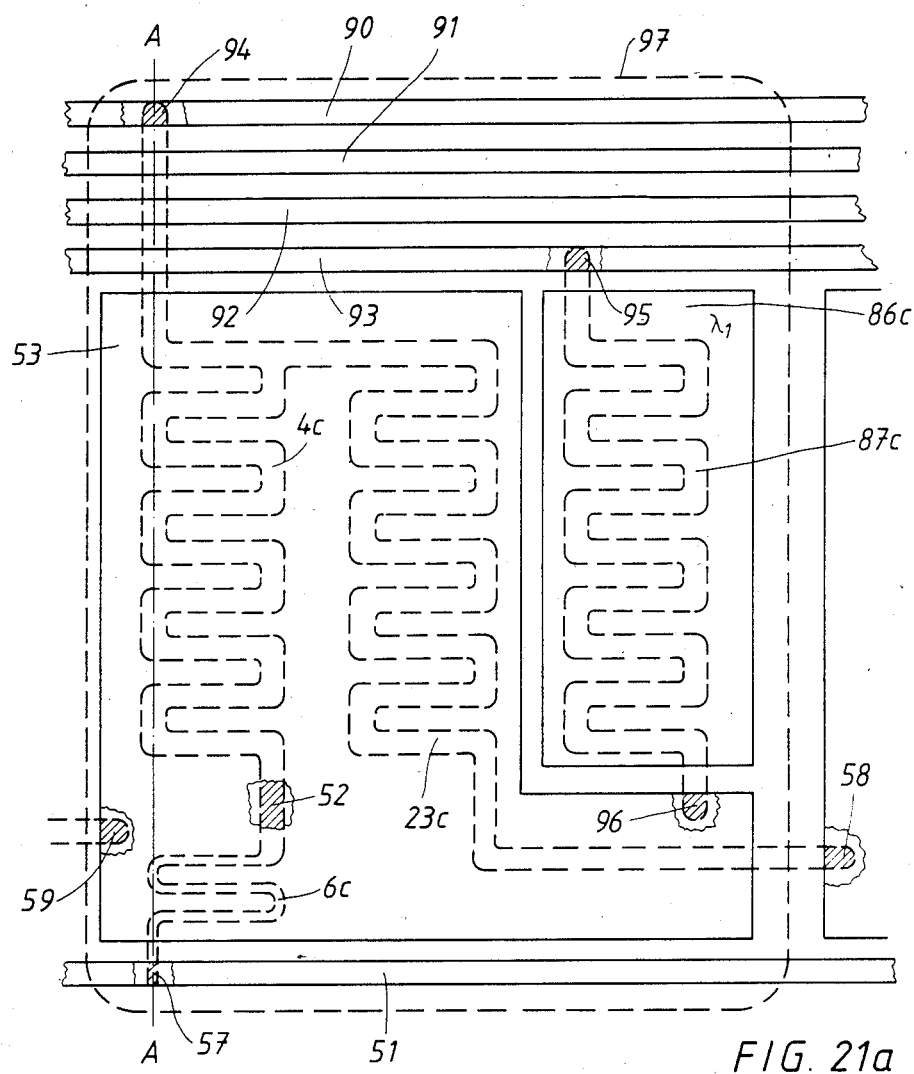
FIGS. 21a, 21b are respective schematic plan and sectional views of a practical realisation of a memory element according to FIG. 20.
Figure 21B:
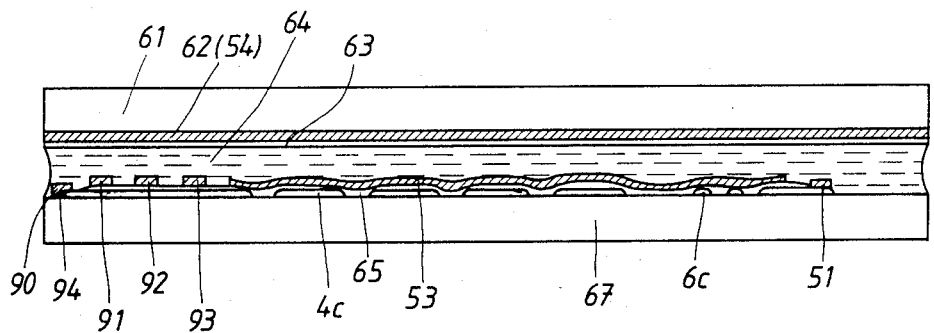

How the memory element of FIG. 20 can be realized is shown in FIGS. 21a and 21b. In FIG. 21b, 61 is an upper transparent plate, 62 a transparent electrically conducting layer, 63 a light-polarizing layer, 64 a liquid crystal, 53 a transparent electrically conducting layer, 51, 90, 91, 92 and 93 electrically conducting paths, 65 an insulator layer, 4c a photo-resistor layer, 6c a resistor layer and 67 a bottom plate. FIG. 21a shows the memory element from above. 90, 91, and 92 are the clock pulse conductors which are controlled by the switches 27, 26 and 25, respectively (cf. FIG. 20). 93 is the conductor for the control of the reading of the optical information. The photo-resistor 4c is connected at point 94 to the conductor 90 and at point 52 to the electrode 53 and the resistor element 6c, which is connected at its other end to the conductor 51, common for all memory elements, at point 57. The photo-resistor 23c is connected at one end to 90 via 94 and to the lead to 4c, and at the other end it is connected to the electrode of the next memory element at point 58. For reading in optical information to the memory element, the electrode 53 is connected at point 96 to the photo-resistor 87c, which at its other end is connected to the conductor 93 at point 95. 87c is coated with an interference filter 86c which filters away the light which is used for the electro-optical feedback of the memory element.

Figure 22:
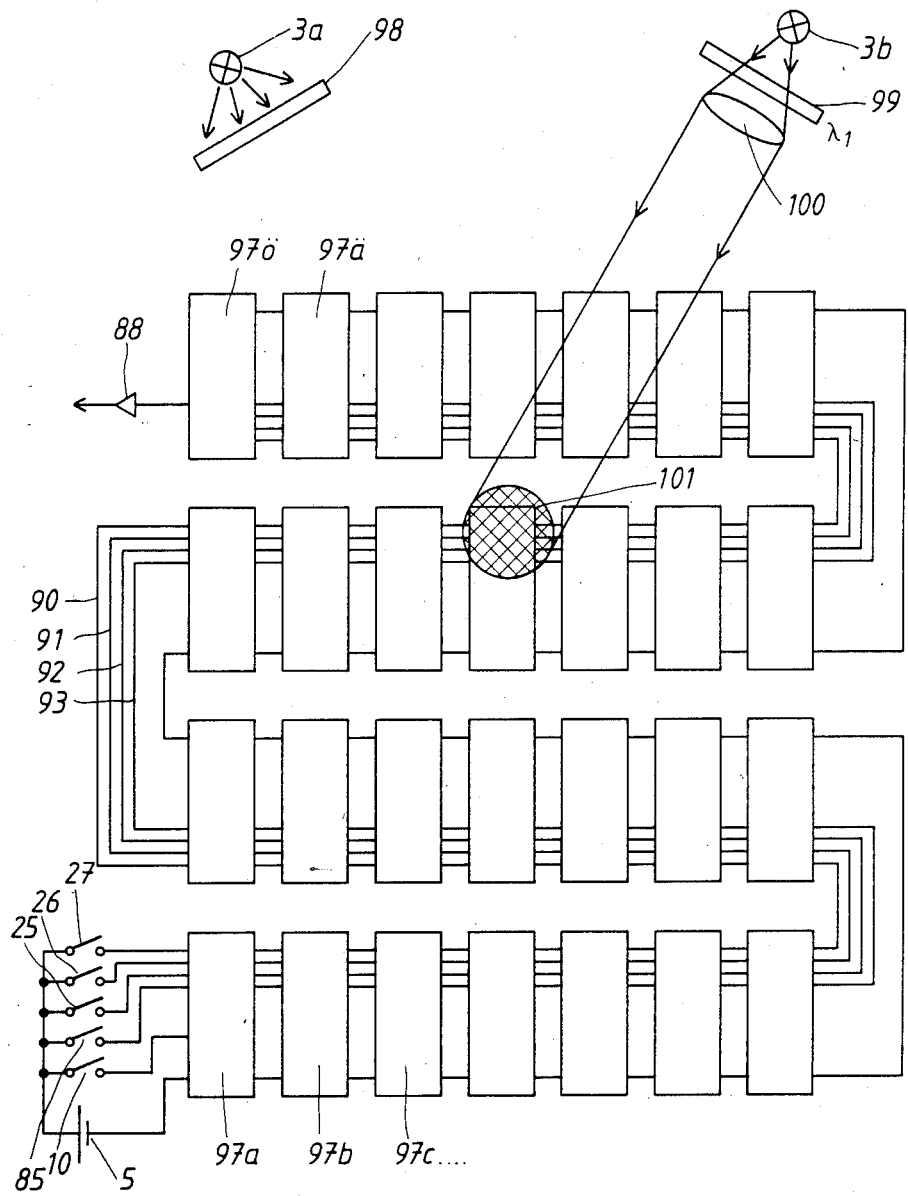
FIG. 22 is a schematic representation of a combined display and digitizer using elements according to FIGS. 20 and 21.

With the aid of the memory elements of the type as shown in FIGS. 20 and 21, a combined display and digitizer can be built up, which is exemplified in FIG. 22. By a series connection of the memory elements, a long shift register is obtained, which is clocked electrically by the switches 25–27 and to which electrical information ("ones" and "zeros") can be fed in by means of the switch 10. The information can be fed out again, after having passed through the shift register (97a, b, c, etc.), by means of the amplifier 88. The function of the memory elements is ensured by the light from the light source 3a, which passes through the filter 98, the task of which is to filter away light around the wavelength $\lambda_1$. The light from the light source 3b passes through the filter 99, which filters out the light around the wavelength $\lambda_1$, and is used for optical input of information into the memory elements. The optically fed information is fed out via the amplifier 88 by means of the switches 25–27. For example, the optical input of information can be carried out with an optical pen.

Figure 23:
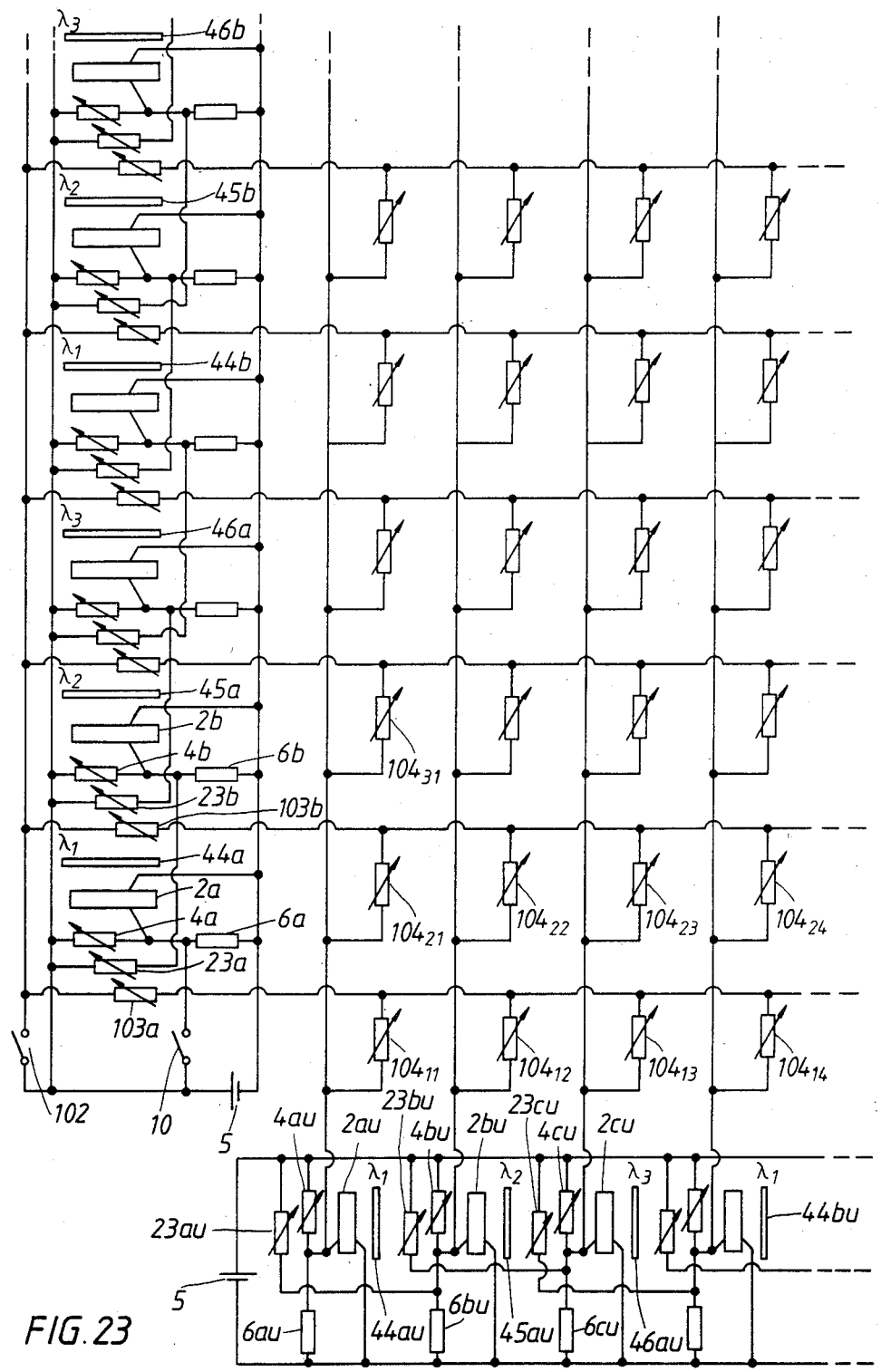
FIG. 23 is an optical XY detector sensed by a memory element as shown in FIG. 20.

FIG. 23, finally, shows an optical xy detector which is sensed by a shift register of the type as shown in FIG. 20. The vertical shift register on the left-hand side in FIG. 23 is used for addressing the rows in the photo-resistor matrix with the photo-elements $104_{11}$, $104_{21}$ ... $104_{12}$, $104_{22}$, etc. The horizontal shift register in the bottom part of FIG. 23 is used for reading off which photo-resistors, in the row addressed by the vertical shift register, are illuminated. Both shift registers are clocked optically. The addressing of the rows is done with the switch 10 and the reading of the illuminated photo-resistors is done by an amplifier (not shown in FIG. 23), which is connected to the output of the horizontal shift register. The mode of operation can be described by an example:

Assume that a "one" is shifted two steps in the vertical shift register. Then the optical modulator 2b will have a high transmission and the photo-resistor 103b a low resistance. Assume further that the photo-resistor $104_{23}$ is illuminated and that the horizontal shift register is set to "zero". If now the switch 102 is closed for a moment, the voltage across the modulator 2cu, via the low-ohmic photo-resistors 103b and $104_{23}$, will become sufficiently high to set this memory element to "zero". By shifting out this "one", the position of the illuminated photo-resistor in the x-direction will then be obtained as the number of shift stages. The position in the y-direction is obtained as the number of steps that a "one" is shifted in the vertical register.

The EO memory elements, flip-flops and shift registers described herein can, of course, be combined in a large number of ways to obtain displays and digitizers having different properties.

The means according to the above can be varied in many ways within the scope of the following claims.

What is claimed is:

1. A shift register operating with information in electrical and optical form, comprising:
   a plurality of series-connected electro-optical memory (EOM) circuits, each being capable of transforming electrical signals into optical signals and optical signals into electrical signals, each said EOM circuit including an optical modulator for modulating the light from a light source and a photo-detector circuit including light sensitive means, said optical modulator and said photo-detector circuit being interconnected with one another to provide an electro-optical feedback loop including light transmission means for transmitting light signals from said optical modulator and means for converting said light signals into electrical signals, and including said photo-detector circuit, to provide an electrical input to said optical modulator and a modulated optical output in response thereto;
   an additional photo-detector for transmission of information between each of said series-connected EOM circuits;
   means responsive to said additional photo-detector circuit to control an EOM circuit in at least one succeeding EOM circuit; and
   a substrate containing said plurality of series-connected EOM circuits and each said additional photo-detectors in the form of an integrated circuit, said optical modulator including a liquid crystal substance, and first and second electrically-conducting spaced layers between which is located said liquid crystal substance with said first electrically-conductive layer being spaced a greater distance from said substrate than said second electrically-conducting layer, and a respective light-polarizing element respectively adjacent said first and second electrically-conducting layers.

2. A device according to claim 1, wherein each said EOM circuit has a non-linear characteristic with negative gain in at least one region of its operating range and positive gain in at least one other region of its operating range, and further comprising means in said electro-optical feedback loop for triggering said EOM circuit and means for setting said EOM circuit into a given binary state.

3. A device according to claim 2, wherein for a voltage less than a certain value between said first and second electrically-conducting layers, the polarization direction of the light from said light source which has passed through said liquid crystal substance is rotated with increasing voltage between said first and second electrically-conducting layers in such a way that the difference in the polarization directions between the light emitted from the liquid crystal and the optical polarizing element adjacent said substrate approaches 90 degrees, corresponding to a minimum light transmission through said optical modulator, and that, for a voltage greater than said certain value, the aforesaid difference in the polarization direction departs from 90 degrees to increase the light transmission through said optical modulator.

4. The shift register as claimed in claim 1, wherein each said light-sensitive means is a photo-resistor and each said EOM circuit further including at least one resistor connected to said photo-resistor, and formed on said substrate by respective photo-resistance material and resistance material and said substrate further including conduction patterns interconnecting said photo-resistor and said at least one resistor, and electrodes for each of said optical modulators.

5. The shift register as claimed in claim 1, wherein each said light-sensitive means is photodiode, and additionally functioning for the transmission of information between other EMO circuits, said photodiodes being formed on the substrate along with at least one resistor and electrically interconnected by conducting patterns on said substrate.

6. The shift register as claimed in claim 1, further comprising means for generating clock pulses and means responsive to said clock pulses for electrically connecting each of said additional photo-detectors to that EOM circuit to which the information is to be transferred such that such EOM circuit acquires the same state as the EOM circuit sensed by said additional photo-detector.

7. The shift register as claimed in claim 6, wherein each said phot-detector circuit includes at least three photo-resistors, one photo-resistor being used for the electro-optical feedback, one photo-resistor carrying information forwards in the shift register, and the remaining photo-resistor carrying information backwards in the shift register, the direction of information transmission being determined by the order of the sequence of said clock pulses.

8. The shift register as claimed in claim 6, wherein one or more of said photo-detector circuits comprises a photo-resistor, which when illuminated raises or lowers the voltage across the optical modulator associated therewith, so that positive or negative feedback is obtained, for reading optical information into the shift register.

9. The shift register as claimed in claim 8, wherein said photo-resistor is connected between two EMO circuits in two separate shift registers, and further comprising an XY matrix of photo-resistors, and said two shift registers are adapted for reading from said XY matrix of photo-resistors.

10. The shift register as claimed in claim 6, further comprising a liquid crystal type display and an XY matrix for modulating said liquid crystal display, and wherein said shift register is connected to said XY matrix for modulation of said liquid crystal display.

11. A plurality of shift registers as claimed in claim 6 series-connected on a glass plate to form a display.

12. A plurality of shift registers as claimed in claim 6, and arranged on a glass plate to form a display, the display consisting of combined series- and parallel-connected shift registers of said plurality of shift registers.

13. The shift register as claimed in claim 6 wherein each said EMO circuit includes at least one photo-resistor, and a resistor connected thereto and having less resistance-dependence than said at least one photo-resistor for the light emitted from said light source, said series-connected resistor network being connected to a voltage source, the electrodes of said optical modulator being connected across said one resistor or said photo-resistor, and the junction of said resistor and photo-resistor network being connected to a photo-resistor in the preceding adjacent EMO circuit, and said junction in said preceding adjacent EMO circuit being connected to the associated EMO circuit through another photo-resistor operative with the optical modulator thereof, and further comprising an optical filter associated with said optical modulator.

14. The shift register as claimed in claim 13, wherein the transmission spectra of the optical filters are the same for specified ones of said EMO circuits and that for each type of filter spectrum there is provided another light source, the emitted light of which can pass the respective optical filter type, but only to a limited extent for the other types of filters, and further comprising means for electric-timed switching of the light sources for optical addressing of each of said EMO circuits.

15. The shift register as claimed in claim 6, further comprising means for connecting said clock pulses to every other one of said additional photo-detectors at a given time, whereby the transmission of information is isolated between a specified number of said EMO circuits.

16. The shift register as claimed in claim 6 or 15 wherein said clock pulses are in the form of light, and further comprising an optical filter associated with each of said optical modulators for passing only said light clock pulses.

17. The shift register as claimed in claim 1, wherein each of said plurality of series-connected EOM circuits further including at least one photo-resistor, and a resistor connected thereto and having less resistance-dependence than said at least one photo-resistor for the light emitted from said light source, said series-connected resistor network being connected to a voltage source, an electric switch connected between said voltage source and said series-connected resistor network, the electrodes of said optical modulator being connected across one of said resistor or said photo-resistor, whereby at voltages less than a certain value across said optical modulator electrodes a negative electro-optical feedback is obtained, and at voltages greater than said certain value a positive feedback is obtained, at least one additional photo-resistor being connected to the junction of said photo-resistor and said resistor of the immediately preceding EOM circuit for transmitting information between the two interconnected EOM circuits.

18. The shift register as claimed in claim 17 further comprising at least one electrical switch connected between said voltage source and the junction of said photo-resistor and said resistor for inputting information to said shift register.

19. The shift register as set forth in claim 1 further comprising at least an additional optical modulator and photo-detector and a light source for illuminating one of said photo-detectors through one of said optical modulators and the other photo-detector through the other of said optical modulators, one of said optical modulators being connected to one of said photo-detectors and the other optical modulator being connected to the other of said photo-detectors to provide a cross-connected feedback.

20. A shift register according to claim 1 wherein said semiconductor includes n-type and p-type material, and said light-polarizing material is electrically insulating.

21. A shift register as claimed in claim 16 wherein the transmission spectra of the optical filters are the same for every second or third EOM circuit and that for each type of filter spectrum there is provided a light source, the emitted light of which can pass the respective optical filter type, but only to a limited extent for the other types of filters, and further comprising means for electric switching of the light sources for optical addressing of said EOM circuits.

22. In an optically-coupled shift register as claimed in claim 1, the improvement comprising:
an optically responsive interstage coupling element having a nonlinear electro-optical characteristic with plus and minus characteristic regions; and
coupling means common to said element, including means for selectively operating said interstage coupling element in said plus and minus characteristic regions, and connected to each of at least two of said EOM circuits for selectively shifting the "0" or "1".

23. The shift register as claimed in claim 1, wherein each of said optical modulator circuits includes said liquid crystal, and said integrated circuit including thick and thin film circuits and semiconductor material, and including a light-reflecting layer, photo-resistance and resistance material on said light-reflecting layer, additional electrically-conducting transparent layers, and an interference filter layer, said layers being located between a bottom portion of said substrate and said liquid crystal.

24. A liquid crystal type display device, comprising:
an XY matrix formed by a number of shift register devices each operating with information in electrical and optical form and comprising:
a plurality of series-connected electro-optical memory (EOM) circuits, each being capable of transforming electrical signals into optical signals and optical signals into electrical signals, each said EOM circuit including an optical modulator for modulating the light from a light source and a photo-detector circuit including light sensitive means, said optical modulator and said photo-detector circuit being interconnected with one another to provide an electro-optical feedback loop including light transmission means for transmitting light signals from said optical modulator and means for converting said light signals into electrical signals, and including said photo-detector circuit, to provide an electrical input to said optical modulator and a modulated optical output in response thereto;
an additional photo-detector for transmission of information between each of said series-connected EOM circuits;
means responsive to said additional photo-detector circuit to control an EOM circuit in at least one succeeding EOM circuit; and
a substrate containing said plurality of series-connected EOM circuits and each said additional photo-detectors in the form of an integrated circuit, said optical modulator including a liquid crystal substance, and first and second electrically-conducting spaced layers between which is located said liquid crystal substance with said first electrically-conductive layer being spaced a greater distance from said substrate than said second electrically-conducting layer, and a respective light-polarizing element respectively adjacent said first and second electrically-conducting layers;
light source means for generating clock pulses and means responsive to said clock pulses for electrically connecting each of said additional photo-detectors to that EOM circuit to which the information is to be transferred such that said EOM circuit acquires the same state as the EOM circuit sensed by said additional photo-detector;
said liquid crystal type display device, comprising:
a liquid display comprising an XY matrix of liquid crystal elements;
respective first and second reading photoresistors equal in number to the number of shift registers in the respective X and Y directions of said XY matrix for interconnecting a respective one of said number of shift registers to at least one of said liquid crystal elements;
means for inputting information into said number of shift registers; and
said light source means respectively selectively clocking the information in said number of shift registers.

25. A display device comprising:
at least one shift register operating with information in electrical and optical form, comprising:
a plurality of series-connected electro-optical memory (EOM) circuits, each being capable of transforming electrical signals into optical signals and optical signals into electrical signals, each said EOM circuit including an optical modulator for modulating the light from a light source and a photo-detector circuit including light sensitive means, said optical modulator and said photo-detector circuit being interconnected with one another to provide an electro-optical feedback loop including light transmission means for transmitting light signals from said optical modulator and means for converting said light signals into electrical signals, and including said photo-detector circuit, to provide an electrical input to said optical modulator and a modulated optical output in response thereto;
an additional photo-detector for transmission of information between each of said series-connected EOM circuits;
means responsive to said additional photo-detector circuit to control an EOM circuit in at least one succeeding EOM circuit; and
a substrate containing said plurality of series-connected EOM circuits and each said additional photo-detectors in the form of an integrated circuit, said optical modulator including a liquid crystal substance, and first and second electrically-conducting spaced layers between which is located said liquid crystal substance with said first electrically-conductive layer being spaced a greater distance from said substrate than said second electrically-conducting layer, and a respective light-polarizing element respectively adjacent said first and second electrically-conducting layers;

means for generating clock pulses and means responsive to said clock pulses for electrically connecting each of said additional photo-detectors to that EOM circuit to which the information is to be transferred such that such EOM circuit acquires the same state as the EOM circuit sensed by said additional photo-detector;

at least one of said photo-detector circuits comprises a photo-resistor, which when illuminated alters the voltage across the optical modulator associated therewith for reading optical information into the shift register; and further comprising:

means for optically writing information into said at least one shift register; and a computer connected to receive the information output from said at least one shift register, for storage and display of said information.

26. A liquid cyrstal type display device, comprising:

an XY matrix formed by a number of shift register devices each operating with information in electrical and optical form and comprising:

First and second shift registers, each of said first and second shift registers comprising:

a plurality of series-connected electro-optical memory (EOM) circuits, each being capable of transforming electrical signals into optical signals and optical signals into electrical signals, each said EOM circuit including an optical modulator for modulating the light from a light source and a photo-detector circuit including light sensitive means, said optical modulator and said photo-detector circuit being interconnected with one another to provide an electro-optical feedback loop including light transmission means for transmitting light signals from said optical modulator and means for converting said light signals into electrical signals, and further including said photo-detector circuit, to provide an electrical input to said optical modulator and a modulated optical output in response thereto;

an additional photo-detector for transmission of information between each of said series-connected EOM circuits;

means responsive to said additional photo-detector circuit to control an EOM circuit in at least one succeeding EOM circuit; and a substrate containing said plurality of series-connected EOM circuits and each said additional photo-detectors in the form of an integrated circuit, said optical modulator including a liquid crystal substance, and said first and second electrically-conducting spaced layers between which is located said liquid crystal substance with said first electrically-conductive layer being spaced a greater distance from said substrate than said second electrically-conducting layer, and a respective light-polarizing element respectively adjacent said first and second electrically conducting layers;

light source means for generating clock pulses and means responsive to said clock pulses for electrically connecting each of said additional photo-detectors to that EOM circuit to which the information is to be transferred such that said EOM circuit aacquires the same state as the EOM circuit sensed by said additional photo-detector:

matrix electrodes for the input and output of data;

first and second transparent plates for mounting the respective components of said first and second shift registers and said matrix electrodes; and said first and second transparent plates being mounted in confronting relationship to each other with an intermediate layer of liquid crystal therebetween.

* * * * *